(12) United States Patent
Taylor et al.

(10) Patent No.: US 7,653,840 B1
(45) Date of Patent: Jan. 26, 2010

(54) EVALUATING AND REPAIRING ERRORS DURING SERVICING OF STORAGE DEVICES

(75) Inventors: James A. Taylor, Livermore, CA (US);
Sharon A. Gavarre, Fremont, CA (US);
Faris Hindi, Mountain View, CA (US);
Tim K. Emami, San Jose, CA (US)

(73) Assignee: Net App, Inc., Sunnyvale, CA (US)

( * ) Notice: Subject to any disclaimer, the term of this patent is extended or adjusted under 35 U.S.C. 154(b) by 447 days.

(21) Appl. No.: 11/796,564

(22) Filed: Apr. 27, 2007

(51) Int. Cl.
*G06F 11/00* (2006.01)

(52) U.S. Cl. .............................. 714/47; 714/8
(58) Field of Classification Search ............ 714/47, 714/8
See application file for complete search history.

(56) References Cited

U.S. PATENT DOCUMENTS

| | | | |
|---|---|---|---|
| 5,422,890 A * | 6/1995 | Klingsporn et al. | 714/723 |
| 5,761,411 A * | 6/1998 | Teague et al. | 714/47 |
| 6,574,754 B1 * | 6/2003 | Smith | 714/47 |
| 7,304,816 B2 * | 12/2007 | Johnson et al. | 360/31 |
| 7,562,282 B1 * | 7/2009 | Rothberg | 714/785 |
| 2004/0051988 A1 * | 3/2004 | Jing et al. | 360/31 |
| 2006/0158976 A1 * | 7/2006 | Fukunaga et al. | 369/44.34 |
| 2009/0106602 A1 * | 4/2009 | Piszczek et al. | 714/42 |
| 2009/0128142 A1 * | 5/2009 | Deng et al. | 324/212 |

OTHER PUBLICATIONS

U.S. Appl. No. 11/796,565, filed Apr. 27, 2007, Taylor.
U.S. Appl. No. 11/796,619, filed Apr. 27, 2007, Taylor.

* cited by examiner

*Primary Examiner*—Emerson C Puente
(74) *Attorney, Agent, or Firm*—Stattler-Sug PC

(57) ABSTRACT

A storage management module for evaluating and repairing errors during monitoring or testing of storage devices of a storage system is described herein. When a storage device exhibits errors that reaches (in number) an error threshold, the storage management module determines whether any errors are due to damaged sectors localized in a single physical area of a predetermined size (referred to as a "patch") of a platter of the storage device using the physical addresses of the errors. Two or more errors may be grouped as a single error if they are located within a predetermined threshold distance from each other on a platter and counted as a single error against the error threshold. A patch containing two or more damaged sectors is referred to as a "damaged" patch. In some embodiments, all sectors of a damaged patch (including undamaged sectors) are reassigned to spare sectors.

23 Claims, 21 Drawing Sheets

| Disk Type | Monitoring Parameters 710 | Testing Parameters 720 |
|---|---|---|
| 1 | Error type = fatal error<br>  ET = 1    RA = fail disk<br>Error type = timeout error<br>  ET = 5    RA = test disk<br>Error type = recoverable error<br>  ET = 8    RA = fail disk<br>Error type = unrecoverable media error<br>  ET = 6    RA = defer to RAID<br>Error type = unrecoverable non-media error<br>  ET = 9    RA = fail disk<br>... | Cycle of tests in sequence:<br>Data integrity test - 1 iteration<br>  1st iteration: Error types = Recoverable, Media; ET = 3; RA = fail disk<br>Self test - 1 iteration<br>  1st iteration: Error types = All: ET = 2; RA = fail disk<br>Media scan test - 3 iterations<br>  1st iteration: Error types = Recoverable, Media Data; ET = 4; RA = fail disk<br>  Error types = Timeout, Missing; ET = 1; RA = fail disk<br>  2nd and 3rd iterations: Error types = All: ET = 1; RA = fail disk<br>Total cycles = 2<br>  1st cycle = initial ETs; 2nd cycle = initial ETs -1 |
| 2 | Error type = fatal error<br>  ET = 1    RA = fail disk<br>Error type = timeout error<br>  ET = 3    RA = test disk<br>Error type = recoverable error<br>  ET = 4    RA = test disk<br>Error type = unrecoverable media error<br>  ET = 4    RA = fail disk<br>Error type = unrecoverable non-media error<br>  ET = 11   RA = defer to RAID<br>... | Cycle of tests in sequence:<br>Write test - 2 iterations<br>  1st iteration: Error types = Recoverable, Hardware, Timeout; ET = 20; RA = fail disk<br>  Error types = Not Ready, Hardware, Timeout; ET = 1; RA = fail disk<br>  2nd iteration: Error types = Hardware, Timeout; ET = 1; RA = continue testing<br>...<br>Total cycles = 3 |
| ... | ... | ... |
| N | | |
| All other disk types | Error type = fatal error<br>  ET = 1    RA = fail disk<br>Error type = timeout error<br>  ET = 3    RA = test disk<br>... | Cycle of tests in sequence:<br>Data integrity test - 1 iteration<br>  1st iteration: Error types = Recoverable, Media Data; ET = 4; RA = fail disk<br>Total cycles = 1 |

| Disk ID | Monitoring Data 1110 | Testing Data 1120 |
|---|---|---|
| X (Disk Type 3) | Fatal error counter: 0<br>Timeout error counter: 3<br>Recoverable error counter: 4<br>Unrecoverable media error counter: 0<br>Unrecoverable non-media error counter: 5<br>... | First Cycle of tests:<br>Data integrity test<br>  1st iteration<br>    Recoverable error counter: 2; Timeout error counter: 0<br>Self test<br>  1st iteration<br>    Timeout error counter: 1; Hardware error counter: 4<br>  2nd iteration<br>    Recoverable error counter: 4; Missing error counter: 4<br>    ...<br>Second Cycle of tests:<br>Media scan test<br>  1st iteration<br>    Timeout error counter: 1; Hardware error counter: 4<br>Data integrity test<br>  1st iteration<br>    Recoverable error counter: 1; Timeout error counter: 0<br>  2nd iteration<br>    Recoverable error counter: 1; Missing error counter: 3<br>    ... |
| Y (Disk Type 5) | Fatal error counter: 0<br>Timeout error counter: 1<br>Recoverable error counter: 0<br>Unrecoverable media error counter: 2<br>Unrecoverable non-media error counter: 3<br>... | First Cycle of tests:<br>Write test<br>  1st iteration<br>    Unrecoverable media error counter: 5<br>Data integrity test<br>  1st iteration<br>... |
| ... | ... | |

EVALUATING AND REPAIRING ERRORS DURING SERVICING OF STORAGE DEVICES

FIELD OF THE INVENTION

The present invention relates to storage systems, and particularly, to evaluating and repairing errors during servicing of storage devices of a storage system.

BACKGROUND OF THE INVENTION

A file server is a computer that provides file service relating to the organization of information on storage devices, such as disks. The file server or filer may be embodied as a storage system including a storage operating system that implements a file system to logically organize the information as a hierarchical structure of directories and files on the disks. As used herein, the term "storage operating system" generally refers to the computer-executable code operable on a storage system that manages data access and client access requests and may implement file system semantics in implementations involving filers. In this sense, the Data ONTAP™ storage operating system, available from Network Appliance, Inc. of Sunnyvale, Calif., which implements a Write Anywhere File Layout (WAFL™) file system, is an example of such a storage operating system implemented as a microkernel within an overall protocol stack and associated disk storage. The storage operating system can also be implemented as an application program operating over a general-purpose operating system, such as UNIX® or Windows®, or as a general-purpose operating system with configurable functionality, which is configured for disk servicing applications as described herein.

A storage system's disk storage is typically implemented as one or more storage volumes that comprise physical storage disks, defining an overall logical arrangement of storage space. Available storage system implementations can serve a large number of discrete volumes (150 or more, for example). A storage volume is "loaded" in the storage system by copying the logical organization of the volume's files, data and directories into the storage system's memory. Once a volume has been loaded in memory, the volume may be "mounted" by one or more users, applications, devices, etc. permitted to access its contents and navigate its namespace.

A storage system may be configured to operate according to a client/server model of information delivery to thereby allow many clients to access files stored on a server, e.g., the storage system. In this model, the client may comprise an application, such as a file-system protocol, executing on a computer that "connects" to the storage system over a computer network, such as a point-to-point link, shared local area network (LAN), wide area network (WAN), or virtual private network (VPN) implemented over a public network such as the Internet. Communications between the storage system and its clients are typically embodied as packets sent over the computer network. Each client may request the services of the storage system by issuing file-system protocol messages formatted in accordance with a conventional file-system protocol, such as the Common Internet File System (CIFS) or Network File System (NFS) protocol.

Conventionally, the storage operating system monitors any errors of the storage devices and provides servicing of the storage devices using a set of servicing parameters. The servicing parameters may define error thresholds and recommendations for courses of action to be taken on storage devices exceeding any error thresholds. Conventionally, however, the set of servicing parameters are encoded as code instructions within the storage operating system where modification of the servicing parameters requires modification of the code instructions of the storage operating system. Therefore, to implement a modified set of servicing parameters, a new storage operating system version having modified code instructions would have to be developed by software programmers and then installed onto the storage system. As such, there is a need for a method for modifying disk servicing parameters of a storage operating system in a convenient and non-disruptive manner.

Also, conventionally, the storage operating system may be configured to send disk and storage system data over a computer network to an outside entity (e.g., the provider of the disks or storage system) for performance or error analysis. Conventionally, however, the disk or storage system data is sent to provide overall storage system performance analysis and is not designed to specifically analyze disk errors. Therefore, conventionally, disk and storage system data is collected and sent on a predetermined regular schedule (e.g., collected and sent every week) and does not contain relevant disk or storage system data collected at the time a disk error occurred. As such, the disk or storage system data typically does not contain data for properly analyzing disk errors since the received data may have been collected long after the disk errors occurred and are not relevant for disk error analysis.

Also, the collected disk and storage system data is typically sent in a file comprising a stream of unformatted data having data of particular disks and storage system data randomly interspersed throughout the file. As such, when analyzing problems of a particular disk, the entire file (or several files) is usually searched (often manually) for data pertaining to the particular disk. When a general disk trend or issue across multiple disk types or storage systems is to be analyzed, a specialized programming script needs to be created for searching specific disk or storage system data relevant to the trend or issue (e.g., a script created for searching all data relating to a specific disk error type). As such, it is difficult to analyze errors of a particular disk as well as general disk trends or issues. Therefore, there is a need for a method for sending more relevant disk and storage system data relating to disk errors and a more efficient and convenient method for analyzing such disk and storage system data.

Further, conventionally, when the storage operating system encounters multiple errors of a storage device during servicing (e.g., monitoring or testing) of the storage device, it does not determine whether the errors are localized to a particular physical area of the storage device and counts each error as a separate error. A storage device having multiple errors that reach a specified error threshold may be failed by the storage operating system (and later removed from the storage system) when, in fact, the storage device may have a single localized physical defect, whereby the multiple errors were confined to a small area. Since, conventionally, the storage operating system counts each error as a separate error without determining whether the errors are localized to one area, the storage operating system may unnecessarily and prematurely fail storage devices in the storage system and cause a higher rate of storage device failure than warranted. As such, there is a need for a method for servicing (e.g., monitoring or testing) storage devices that considers localization of errors.

SUMMARY OF THE INVENTION

A method for evaluating and repairing errors during servicing of storage devices of a storage system is described herein. In some embodiments, a storage management module of an operating system of the storage system is used for monitoring and/or testing storage devices of the storage system and receiving data regarding errors of the storage devices. When a storage device exhibits a set of errors of a particular error type that reaches (in number) an error threshold specified for the particular error type, an evaluation module of the storage management module evaluates the set of errors to determine whether any errors are due to damaged sectors localized in a single physical area (having a predetermined size) of a platter of the storage device. In some embodiments, two or more errors of a storage device may be grouped as a single error when the errors are caused by damaged sectors that are located within a predetermined threshold distance (e.g., as specified by a physical length or in a number of tracks and/or sectors) from each other on a platter of the storage device. In some embodiments, two or more errors of a storage device may be grouped as a single error for counting against an error threshold for a particular error type and reduce the number of errors counted against the error threshold. As such, a single physical defect (e.g., a small scratch or foreign particle) on a platter of the storage device that spans multiple sectors and causes multiple storage device errors will be considered a single damaged area and the plurality of storage device errors caused by the single damaged area considered a single error. Conventionally, each error would be counted against the error threshold which may result in unnecessary and premature failing of storage devices and a higher rate of storage device failure than warranted. By considering physical localization of errors on a storage device due to a single damaged area, unnecessary and premature failing of storage devices may be reduced.

In some embodiments, the storage management module receives data regarding errors of a flagged storage device including logical block addresses of the errors and a storage device type of the flagged storage device. If the flagged storage device exhibits a set of errors that reach (in number) an error threshold for a particular error type, the evaluation module is used to translate the logical block addresses of the errors to physical addresses that indicate the physical location of the damaged sectors (that caused the set of errors) on the flagged storage device (e.g., the platter number, track number, and sector number). As such, the physical position of a first damaged sector relative to the physical position of a second damaged sector on a storage device may be determined using the physical addresses of the two sectors to determine if the damaged sectors may be considered as a single damaged area and the errors a single error.

The evaluation module may also determine the logical geometry of the flagged storage device (e.g., as determined from the storage device type of the flagged storage device) that indicates how data is structured onto the platters, tracks and sectors of the flagged storage device. Using the logical geometry of the flagged storage device, the evaluation module may graph physical representations of the platters of the flagged storage device and plot the damaged sectors that caused the set of errors onto the physical representations of the platters using the physical addresses of the set of errors. The evaluation module may then determine whether two or more damaged sectors are within a predetermined threshold distance from each other by determining whether they are contained within a same physical area of predetermined size (referred to as a "patch") on a platter. The predetermined size of a patch may be specified in terms of physical dimensions or in terms of tracks and sectors. In some embodiments, two or more errors due to two or more damaged sectors contained within the same patch on a platter of a storage device may be considered a single error.

A particular patch containing multiple damaged sectors (i.e., two or more sectors that exhibited an error of any error type) may indicate a physical defect (e.g., a small scratch or foreign particle) located within the patch that may eventually affect all sectors in the patch. It may be desirable then, to prevent access to all sectors of a patch that contains multiple damaged sectors to avoid future disk errors (rather than preventing access to only damaged sectors of platters, as conventionally done). A patch overlapping two or more damaged sectors is referred to herein as a "damaged" patch. In some embodiments, a damaged patch may overlap and comprise a mixture of damaged sectors and undamaged sectors (i.e., sectors that have not exhibited errors of any error type). In some embodiments, a repair module of the storage management module receives a damaged patch (comprising damaged and undamaged sectors) of a flagged storage device and remaps/reassigns each sector (including undamaged sectors) of the damaged patch to a spare sector of the flagged storage device cx10 so that none of the sectors of the damaged patch may be accessed in the future.

BRIEF DESCRIPTION OF THE DRAWINGS

The novel features are set forth in the appended claims. However, for purpose of explanation, several embodiments of the invention are set forth in the following figures.

FIG. 7 shows a conceptual diagram of the contents of an exemplary servicing parameters file;

FIG. 11 shows a conceptual diagram of the exemplary contents of a servicing data structure;

DETAILED DESCRIPTION

In the following description, numerous details are set forth for purpose of explanation. However, one of ordinary skill in the art will realize that the embodiments described herein may be practiced without the use of these specific details. In other instances, well-known structures and devices are shown in block diagram form in order not to obscure the description with unnecessary detail.

The description that follows is divided into five sections. Section I describes a storage system environment in which some embodiments operate. Section II describes an operating system and memory of a storage system in which some embodiments operate. Section III describes a storage management module of a storage operating system configured for servicing storage devices of a storage system. Section IV describes a reporting module of the storage management module for providing storage device and storage system data. Section V describes a. method for evaluating and repairing storage device errors that considers localization of the errors.

I. Storage System Environment

Figure 1:
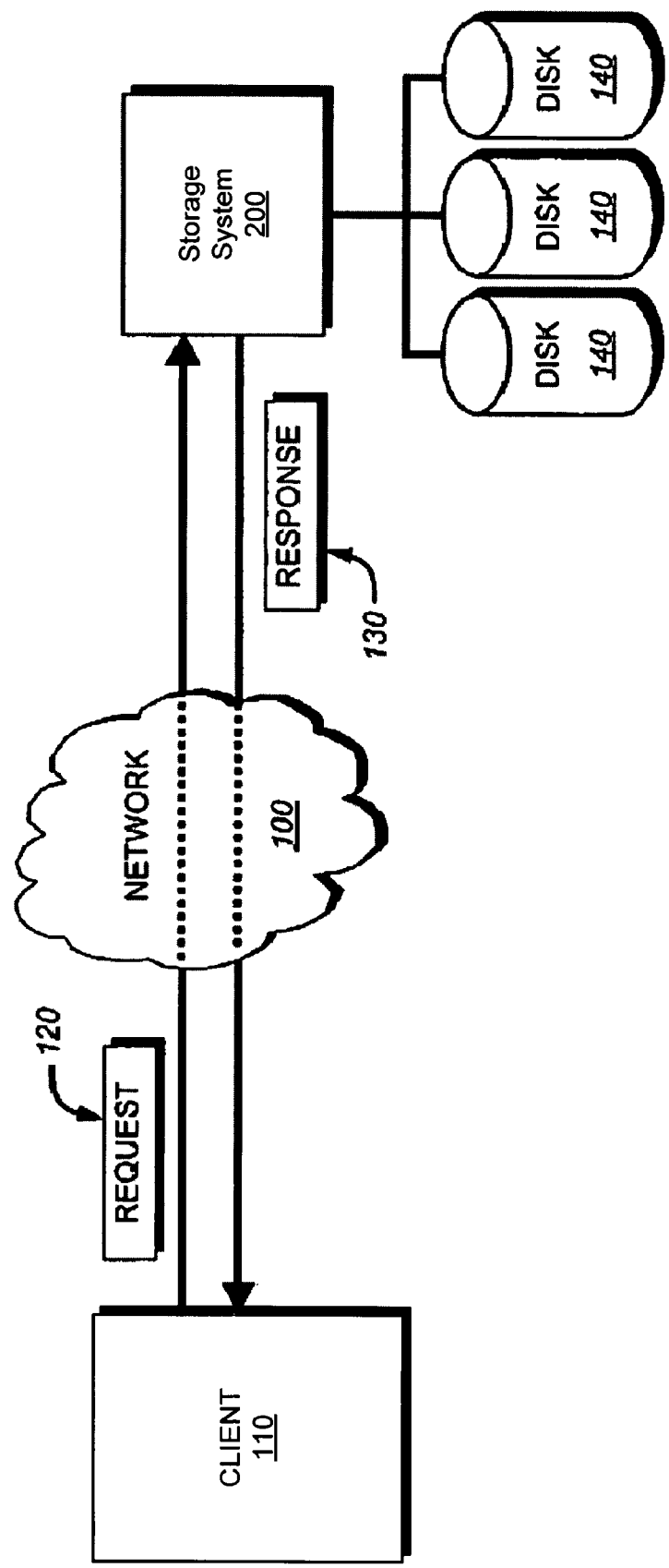
FIG. 1 is a schematic block diagram of an exemplary storage system environment in which some embodiments operate.

FIG. 1 is a schematic block diagram of a storage system environment that includes a network 100 through which a client 110 may communicate with a server, e.g., a storage system 200. The network may comprise one or more point-to-point links, shared local area networks (LAN), wide area networks (WAN), and the like. The storage system server or "storage system" 200 is a computer that provides file service relating to the organization of information on a set of one or more storage devices 140 (such as storage disks). The storage system 200 typically provides file service to a customer entity that uses and owns the storage system 200. A storage system 200 typically comprises an embedded computer system with a microkernel operating system (such as Data ONTAP™). One with ordinary skill in the arts, however, will realize that the embodiments described below may also apply to a general-purpose computer system having a general-purpose operating system (such as UNIX® or Windows®).

In operation, the client 110 may send the storage system 200 a request 120 to access specific data (such as a specific file or directory) stored on the storage devices 140. Examples of requests include open, read, write, or close file requests. The request may be "packetized" and formatted according to predetermined communication protocols (e.g., NFS, CIFS, etc.). The storage system 200 receives and processes the client request 120 and transmits a response 130 to the client 110 over the network 100. Communication between the client 110 and storage system 200 may be file or block based where the storage system 200 receives and responds to file or block based requests. Moreover, the client 110 may interact with the storage system 200 in accordance with a client/server model of information delivery. That is, the client may forward requests 120 for the services of the storage system, and the storage system may return the results 130 of the services requested by the client, by exchanging packets encapsulating, e.g., the CIFS or NFS protocol format over the network 100.

Figure 2:
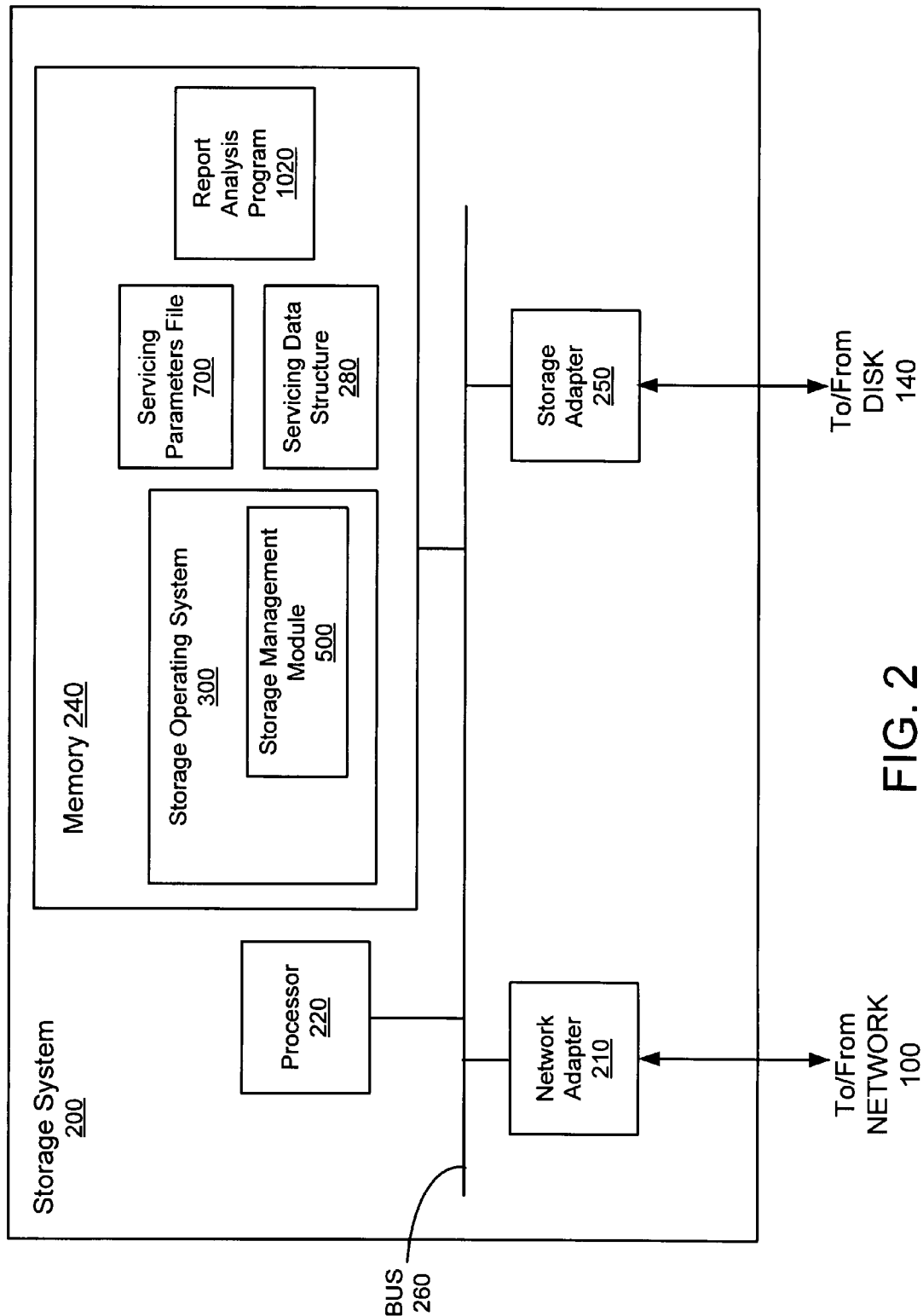
FIG. 2 is a schematic block diagram of an exemplary storage system that may be employed in the storage system environment of FIG. 1.

FIG. 2 is a schematic block diagram of an exemplary storage system 200 that may be employed in the storage system environment of FIG. 1. The storage system 200 comprises a network adapter 210, a processor 220, a memory 240, and a storage adapter 250 interconnected by a system bus 260. Those skilled in the art will understand that the embodiments described herein may apply to any type of special-purpose computer (e.g., file serving appliance) or general-purpose computer, including a standalone computer, embodied or not embodied as a storage system. To that end, storage system 200 can be broadly, and alternatively, referred to as a server system or a computer system. Moreover, the teachings of the embodiments described herein can be adapted to a variety of storage system architectures including, but not limited to, a network-attached storage environment, a storage area network and disk assembly directly-attached to a client/host computer. The term "storage system" should, therefore, be taken broadly to include such arrangements.

The network adapter 210 comprises the mechanical, electrical and signaling circuitry needed to connect the storage system 200 to a client 110 over a computer network 100. The storage system may include one or more network adapters. Each network adapter 210 has a unique IP address and may provide one or more data access ports for clients 110 to access the storage system 200 (where the network adapter accepts client requests in the form of data packets). The memory 240 comprises storage locations that are addressable by the processor 220 and adapters for storing software program code and data. The memory 240 typically comprises a form of random access memory (RAM) that is generally cleared by a power cycle or other reboot operation (e.g., it is a "volatile" memory). The processor 220 and adapters may, in turn, comprise processing elements and/or logic circuitry configured to execute the software code and manipulate the data stored in the memory 240.

The processor 220 executes a storage operating system application 300 of the storage system 200 that functionally organizes the storage system by, inter alia, invoking storage operations in support of a file service implemented by the storage system. In some embodiments, the storage operating system 300 includes a storage management module 500 that is also executed by the processor 220. Portions of the storage operating system 300 are typically resident in memory 240. It will be apparent to those skilled in the art, however, that other processing and memory means, including various computer readable media, may be used for storing and executing program instructions pertaining to the operating system 300 and storage management module 500.

In some embodiments, data of a servicing parameters file 700 is also resident in memory 240. As discussed below, the servicing parameters file 700 contains parameters that are read and loaded into memory 240 by the storage management module 500 and used by the storage management module 500 for servicing (e.g., monitoring and/or testing) the storage devices 140 of the storage system 200. Also resident in memory 240 is a servicing data structure 280 used by the storage management module 500 to record and track data (e.g., storage device identifiers, counters, etc.) regarding storage devices during servicing of the storage devices. In some embodiments, also resident in memory 240 is a report analysis program 1020 that is executed by the processor 220. The report analysis program 1020 may be configured for receiving and processing disk report files from the storage management module 500 (as discussed below in Section IV).

The storage adapter 250 cooperates with the storage operating system 300 executing on the storage system to access information requested by the client 110. The information may be stored on the storage devices 140 that are attached, via the storage adapter 250, to the storage system 200 or other node of a storage system as defined herein. The storage adapter 250 includes input/output (I/O) interface circuitry that couples to the disks 140 over an I/O interconnect arrangement, such as a conventional high-performance, Fibre Channel serial link topology. The information is retrieved by the storage adapter 250 and, if necessary, processed by the processor 220 (or the adapter 250 itself) prior to being forwarded over the system bus 260 to the network adapter 210, where the information is formatted into a packet and returned to the client 110.

In an illustrative embodiment, the storage devices 140 comprise disks that are arranged into a plurality of volumes, each having a file system associated therewith. In one embodiment, the disks 140 are configured into a plurality of RAID (redundant array of independent disks) groups whereby multiple disks 140 are combined into a single logical unit (i.e., RAID group). In a typical RAID group, disks 140 of the group share or replicate data among the disks which may increase data reliability or performance. The disks 140 of a RAID group are configured so that some disks store striped data and at least one disk stores separate parity for the data, in accordance with a preferred RAID-4 configuration. However, other configurations (e.g. RAID-5 having distributed parity across stripes, RAID-DP, etc.) are also contemplated. A single volume typically comprises a plurality of disks 140 and may be embodied as a plurality of RAID groups.

II. Storage Operating System

The organization of a storage operating system for the exemplary storage system is now described briefly. However, it is expressly contemplated that the principles of the embodiments described herein can be implemented using a variety of alternative storage operating system architectures. As discussed above, the term "storage operating system" as used herein with respect to a storage system generally refers to the computer-executable code operable on a storage system that implements file system semantics (such as the above-referenced WAFL™) and manages data access. In this sense, Data ONTAP™ software is an example of such a storage operating system implemented as a microkernel. The storage operating system can also be implemented as an application program operating over a general-purpose operating system, such as UNIX® or Windows®, or as a general-purpose operating system with configurable functionality.

Figure 3:
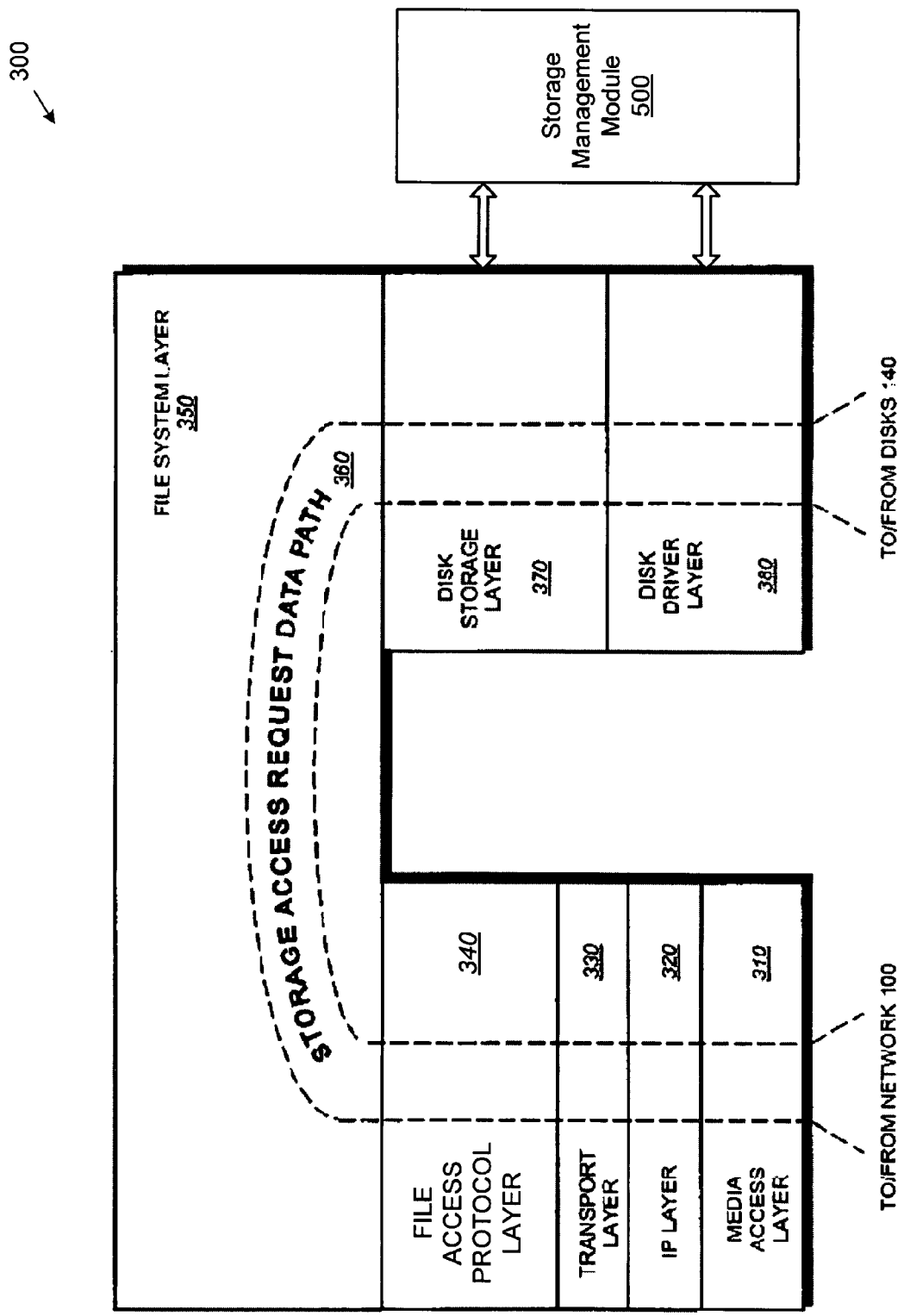
FIG. 3 is a schematic block diagram of an exemplary storage operating system that may be implemented by the storage system in FIG. 2.

As shown in FIG. 3, the storage operating system 300 comprises a series of software layers that form an integrated network protocol stack. The protocol stack provides data paths 360 for clients 110 to access information stored on the storage system 200 using file-access protocols. The protocol stack includes a media access layer 310 of network drivers (e.g., an Ethernet driver). The media access layer 310 interfaces with network communication and protocol layers, such as the Internet Protocol (IP) layer 320 and the transport layer 330 (e.g., TCP/UDP protocol). The IP layer 320 may be used to provide one or more data access ports for clients 110 to access the storage system 200. In some embodiments, the IP layer 320 layer provides a dedicated private port for each of one or more remote-file access protocols implemented by the storage system 200.

A file-access protocol layer 340 provides multi-protocol data access and, for example, may include support for the Hypertext Transfer Protocol (HTTP) protocol, the NFS protocol, and the CIFS protocol. The storage operating system 300 may include support for other protocols, including, but not limited to, the direct access file system (DAFS) protocol, the web-based distributed authoring and versioning (WebDAV) protocol, the Internet small computer system interface (iSCSI) protocol, and so forth. The storage operating system 300 manages the storage devices 140 using a disk storage layer 370 that implements a disk storage protocol (such as a RAID protocol) and a disk driver layer 380 that implements a disk control protocol (such as small computer system interface (SCSI), integrated drive electronics (IDE), etc.).

Bridging the disk software layers with the network and file-system protocol layers is a file system layer 350 of the storage operating system 300. In an illustrative embodiment, the layer 350 implements a file system having an on-disk format representation that is block-based using, e.g., 4-kilobyte (KB) data blocks and using inodes to describe the files. An inode is a data structure used to store information about a file, such as ownership of the file, access permission for the file, size of the file, name of the file, location of the file, etc. In response to receiving a client's file access request 120, the file system generates operations to load (retrieve) the requested data from disks 140 if it is not resident in the storage system's memory. An external file handle in the client request typically identifies a file or directory requested by the client 110. Specifically, the file handle may specify a generation number, inode number and volume number corresponding to the client's requested data.

If the information is not resident in the storage system's memory, the file system layer 350 indexes into an inode file using the received inode number to access an appropriate entry and retrieve a logical volume block number. The file system layer 350 then passes the logical volume block number to the disk storage (RAID) layer 370, which maps that logical number to a disk block number and sends the latter to an appropriate driver (for example, an encapsulation of SCSI implemented on a fibre channel disk interconnection) of the disk driver layer 380. The disk driver 380 accesses the disk block number from disks 140 and loads the requested data in memory 240 for processing by the storage system 200. Upon successful completion of the request, the storage system (and storage operating system) returns a response 130, e.g., a conventional acknowledgement packet defined by the CIFS specification, to the client 110 over the network 100.

In performing a client's file access request 120, however, the storage operating system 300 may encounter a storage device error (disk error) that prevents successful completion of the request. A disk error on a particular disk 140 may occur for any variety of reasons. For example, a physical error/defect at a particular location/block number of a particular disk 140 being accessed by the disk driver 380 may prevent the successful retrieval of requested data at the particular location on the disk 140. Disk errors may be classified into disk error types, each disk error type comprising a grouping of disk errors defined by one or more common characteristics (as discussed further below). In some embodiments, the disk servicing parameters may vary depending on the disk error types (e.g., a first disk error type may have a first error threshold and a second disk error type may have a second different error threshold).

It should be noted that the software "path" 360 through the storage operating system layers described above needed to perform data storage access for the client request received at the storage system may alternatively be implemented in hardware or a combination of hardware and software. That is, in an alternative embodiment, the storage access request path 360 may be implemented as logic circuitry embodied within a field programmable gate array (FPGA) or an application specific integrated circuit (ASIC). This type of hardware implementation may increase the performance of the file service provided by storage system 200 in response to a file system request packet 120 issued by client 110. Moreover, in a further embodiment, the processing elements of network and storage adapters 210 and 250 may be configured to offload some or all of the packet processing and storage access operations, respectively, from processor 220 to thereby increase the performance of the file service provided by the storage system.

III. Storage Management Module for Servicing Storage Devices

A. Storage Management Module

As shown in FIG. 3, in some embodiments, the storage operating system 300 also includes a storage management module 500. The storage management module 500 may be configured for servicing the storage devices 140 to ensure optimal performance of the storage devices 140. In these embodiments, the disk storage (RAID) layer 370 and the disk driver layer 380 interact with the storage management module 500 to help service the disks 140 and may provide data (such as disk error data) regarding the disks 140 to the storage management module 500. Particular disks 140 ("flagged" disks) exhibiting disk errors (as determined by the disk storage layer 370) may be serviced by the storage management module 500 to determine a recommended action to be taken on the flagged disks (e.g., remove the flagged disk from the storage system, return the flagged disk for use in the storage system, etc.). In this way, recommended actions for disks 140 exhibiting errors can automatically (without human intervention) be determined at the storage system site to improve overall storage system reliability and availability.

Figure 4:
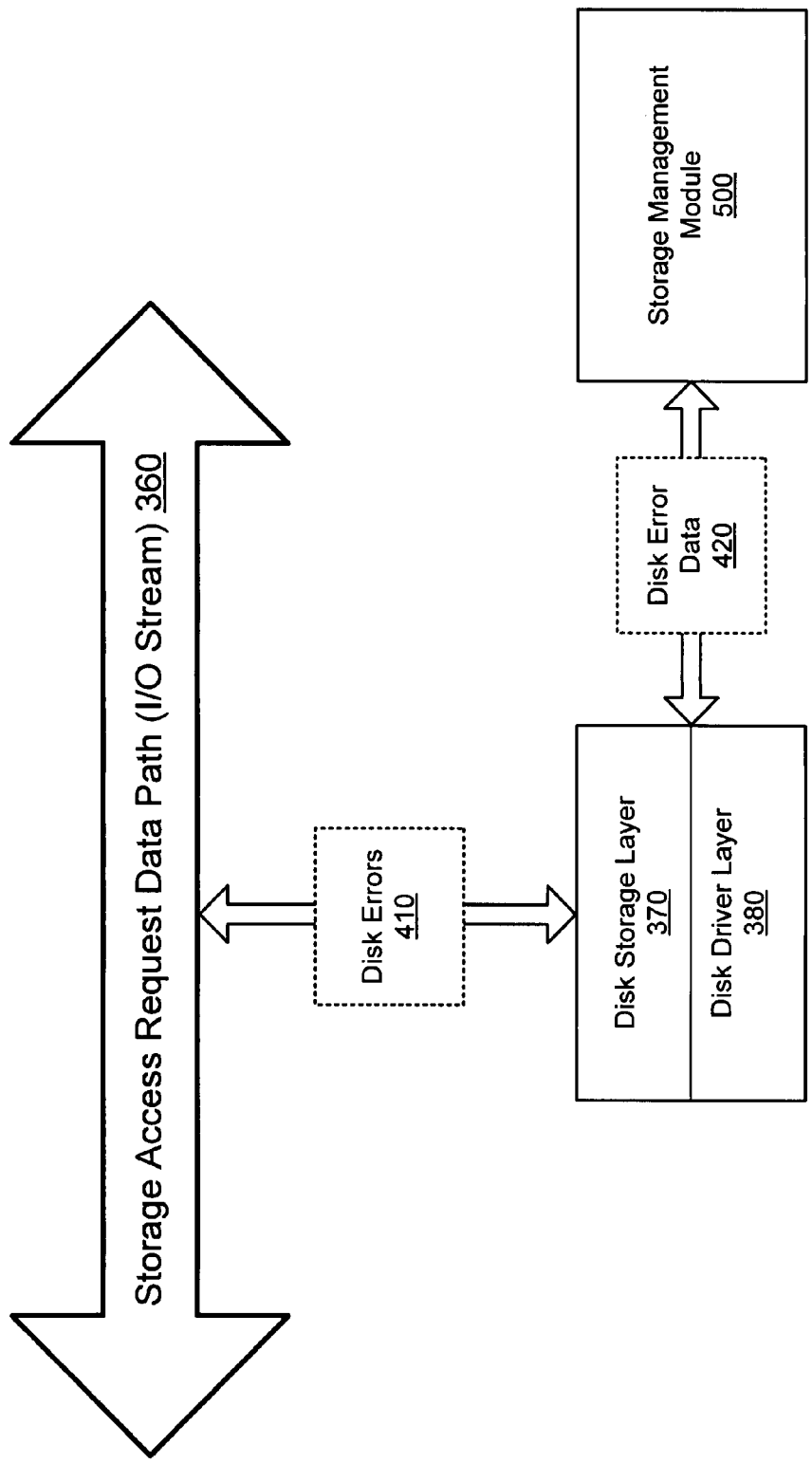
FIG. 4 shows a conceptual diagram of the interaction of the disk storage (RAID) layer and the disk driver layer with the storage management module of the storage operating system.

FIG. 4 shows a conceptual diagram of the interaction of the disk storage (RAID) layer 370 and the disk driver layer 380 with the storage management module 500 of the storage operating system 300. The disk storage layer 370 and disk driver layer 380 monitor and manage the storage access request path 360 (I/O stream) for performing client requests and identify any disk errors 410 encountered during performance of a client request. Specifically, the disk storage (RAID) layer 370 identifies any disk errors 410 encountered in the storage access request path 360 and sends the disk errors to the disk driver layer 380 which attempts to respond to the disk errors 410. Although the disk storage layer 370 may operate in conjunction with the disk driver layer 380 to implement embodiments described herein, for purposes of discussion, the disk storage layer 370 is described herein to interact with the storage management module 500 to implement the embodiments described herein.

A disk error 410 on a particular disk 140 may occur for any variety of reasons. For example, a physical error/defect at a particular location/block number of a disk 140 being accessed by the disk driver 380 may prevent the successful retrieval of requested data at the particular location on the disk 140. As referred to herein, a storage device error (disk error) indicates the unsuccessful accessing of a particular storage device 140 due to any variety of reasons. Disk errors 410 may be classified into disk error types, each disk error type comprising a grouping of disk errors defined by a one or more common characteristics. Examples of disk error types include fatal errors, timeout errors, recoverable errors, unrecoverable errors, etc.

A fatal error is a disk error that prevents communication with the disk or an error returned by the disk which is known to indicate a condition for which the disk should be failed. A timeout error is a disk error that occurs when a read or write request to a particular location of a disk takes too long to perform (i.e., performance of the read or write request exceeds a threshold period of time) as determined by the storage operating system 300. As such, a timeout error does not necessarily indicate a defect of the disk on which the read or write request is performed, but rather, that the delay in performing the read or write request was determined by the storage operating system to exceed a predetermined threshold time period.

A recoverable error is an error returned by the disk which indicates that a request was completed successfully but required performance of internal error recovery algorithms by the disk for successful completion. The recoverable error type may comprise two sub-classes of error types including a media error type and a non-media error type. An unrecoverable error on a disk is an error that is not recoverable in that, even after applying any recovery algorithms and mechanisms available on the disk, a read or write request accessing a particular location on the disk could not be successfully performed whereby a complete set of the requested data could be accessed. The unrecoverable error type may comprise two sub-classes of error types including a media error type and a non-media error type. A media error type comprises errors caused only by a defect of a physical component of a disk (e.g., such as a physical defect of the disk's platter, a read/write head issue, etc.). A non-media error type comprises disk errors that may be partially caused by a physical defect of a disk, but is also at least partially caused by something other than a physical defect of the disk, such as a controller error, a DRAM error, tightly coupled memory error, a firmware detected error, etc. In other embodiments, other disk error types well know in the art are considered (such as recoverable error data, media error data, not ready error, hardware error, missing error, etc.).

For each disk error 410 identified by the disk driver layer 380, the disk driver layer 380 sends data 420 regarding the disk error 410 to the storage management module 500. In some embodiments, for each identified disk error 410, the disk error data 420 includes identification of the particular disk 140 having the disk error 410, the disk type of the particular disk 140, and the error type of the disk error 410. In other embodiments, for each identified disk error 410, the disk error data 420 also includes a logical block address included in the read/write request that caused the disk error 410. The logical block address may be used be an evaluation module (described below in Section V) for determining the physical location of the error in the disk 140. A disk 140 having a disk error may be identified by a disk identifier (e.g., disk handle) that uniquely distinguishes/identifies the disk 140 within the set of storage devices 140 of the storage system 200. A disk 140 determined to have a disk error is sometimes referred to herein as a "flagged" disk.

Disks may be classified into disk types, each disk type comprising a grouping of disks defined by one or more common characteristics. Examples of characteristics used to define disk types comprises manufacturer, model, version, disk size, technology type (e.g., fibre channel (FC) disk, serial attached SCSI (SAS) disk, serial advanced technology attachment (SATA) disk, etc.), or any combination of these characteristics. In some embodiments, the disk servicing parameters may vary depending on the disk types (e.g., a first disk type may have a first error threshold and a second disk type may have a second different error threshold).

In some embodiments, the disk error data 420 is collected by the storage management module 500 to determine rates of particular error types (such as recoverable error rates, timeout error rates, etc.) for particular disk types. The disk error data 420 may be collected for analysis, for example, to determine or predict general disk problems and trends or problems and trends for particular disk types. In some embodiments, analysis of the collected disk error data 420 is used as a basis to modify servicing parameters of the storage management module 500. In these embodiments, a servicing parameters file 700 containing the modified servicing parameters are loaded and read by the storage management module 500.

Figure 5:
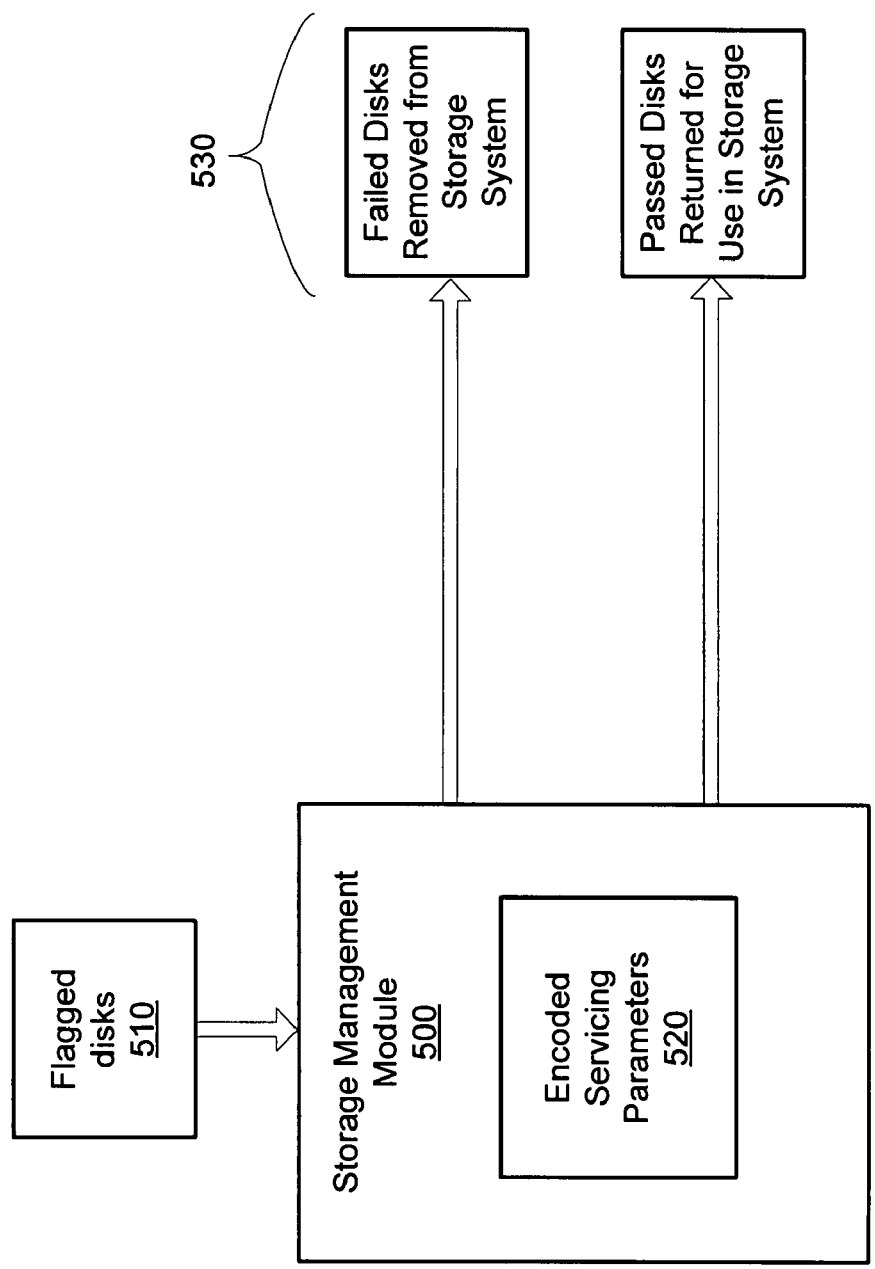
FIG. 5 shows a conceptual diagram of exemplary disk servicing operations of a storage management module.

For each flagged disk having a disk error of a particular disk error type (as indicated in the disk error data 420), the storage management module 500 services the flagged disk using a set of servicing parameters. FIG. 5 shows a conceptual diagram of exemplary disk servicing operations of a storage management module 500. In the example of FIG. 5, the storage management module 500 receives data 420 regarding flagged disks 510 having disk errors (e.g., identifiers uniquely identifying the flagged disks, disk types, and error types of the disk errors) and services (e.g., monitors and/or tests) the flagged disks 510 according to a set of encoded disk servicing parameters 520. The encoded servicing parameters 520 may include error thresholds and recommendations for courses of action to be taken on any disks exceeding any error thresholds during monitoring and/or testing of the disk. As such, the storage management module 500 monitors and/or tests a flagged disk according to the set of encoded servicing parameters 520 to determine a "course of action" recommendation for the flagged disk. Based on the "course of action" recommendation, a particular action 530 corresponding to the recommendation is ultimately performed on the flagged disk (e.g., failing and removing the flagged disk from the storage system or returning the flagged disk for use in the storage system, such as return to a spare pool of disks).

In some embodiments, the storage management module 500 is a component of the storage operating system 300, wherein the storage operating system 300 (including the storage management module 500) comprises a software application comprising a set of executable code instructions. Conventionally, the code instructions of the storage management module 500 include code instructions for the set of servicing parameters 520 (i.e., the set of servicing parameters 520 are encoded as code instructions of the storage management module 500). Therefore, conventionally, to modify the set of servicing parameters 520 (e.g., to change, delete, or add any servicing parameters in the set), the code instructions of the storage management module 500 (and hence, the code instructions of the storage operating system 300) is modified. As such, to implement a modified set of servicing parameters 520 in the storage management module 500, a new storage operating system version having modified code instructions (that reflect the modified servicing parameters) is created by software programmers and then installed onto the storage system 200.

Data regarding the performance and error rates of various storage devices may be collected from a number of different sources. For example, disk error data 420 may be collected by the storage management module 500 to determine rates of particular error types or disk error data may be collected from analysis of returned failed disks, etc. As field data regarding various storage devices is gathered and analyzed, general trends regarding storage devices and trends regarding particular storage device types may be determined. Based on the analysis of field data regarding the storage devices, it may be determined that servicing parameters of the storage operating system require modification to provide optimal servicing of the storage devices.

However, conventionally, the servicing parameters can not be modified in a frequent and timely manner (i.e., within a short time period after modification of the servicing parameters is determined by engineers) since modifications to the servicing parameters will coincide with new version releases of the storage operating system 300. As such, frequent and timely modifications of the servicing parameters 520 that provide optimal servicing of the disks 140 by the storage management module 500 is not provided by conventional means. Further, installing a new version of the storage operating system 300 having the modified servicing parameters 520 is inconvenient and requires downtime of the storage system 200. In some embodiments, modifications of servicing parameters may be provided in a convenient and timely manner by creating and loading an external file containing the modified servicing parameters onto the storage operating system, rather than creating and installing a new storage operating system that is encoded with the modified servicing parameters (as conventionally done).

Figure 6:
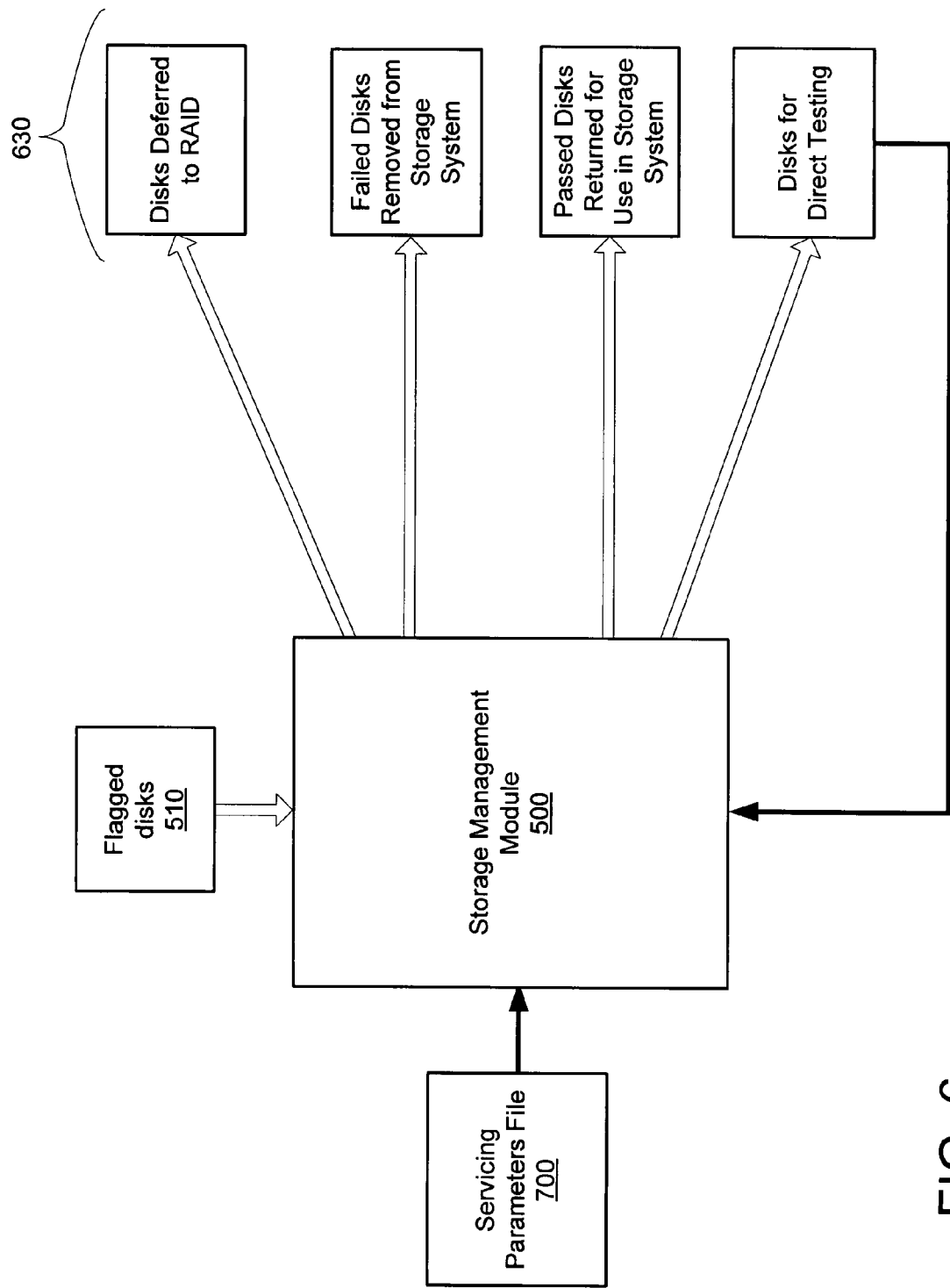
FIG. 6 shows a conceptual diagram of exemplary disk servicing operations of a storage management module that loads and reads a file containing servicing parameters.

FIG. 6 shows a conceptual diagram of exemplary disk servicing operations of a storage management module 500 that loads and reads a file 700 containing servicing parameters. The storage management module 500 loads and reads servicing parameters from the servicing parameters file 700 and stores the servicing parameters into memory (e.g., memory 240 of the storage system 200) for later use by the storage management module 500 in servicing one or more flagged disks 510. The storage management module 500 then monitors and/or tests flagged disks 510 according to the servicing parameters in the file 700 to determine a recommended action for the flagged disks 510. Based on the recommended action, a particular action 630 is ultimately performed on the flagged disk. In some embodiments, one of the recommended actions to be taken on a flagged disk may include further testing of the flagged disk by the storage management module 500 (as discussed below).

Note that the servicing parameters file 700 is external to the storage management module 500 (i.e., is not encoded as code instructions of the storage management module 500), but rather is a file 700 that the storage management module 500 locates to read servicing parameters from the file 700 and then stores into memory. As used herein, the term "file" indicates a container, an object, or any other storage entity that contains a group of related data (such as servicing parameters). In some embodiments, the servicing parameters file 700 is stored at a predetermined location (e.g., in a directory in the root volume of storage system 200), whereby the storage management module 500 is configured to search for the file 700 at the predetermined location. In some embodiments, the storage management module 500 is further configured to periodically check/examine the predetermined location to determine whether a new servicing parameter file 700 (having modified servicing parameters) has been stored to the predetermined location, and if so, to load and read the modified servicing parameters of the new servicing parameter file 700.

FIG. 7 shows a conceptual diagram of the contents of an exemplary servicing parameters file 700. In the example of FIG. 7, the servicing parameters comprise monitoring parameters 710 and testing parameters 720. The monitoring parameters 710 may include parameters such as error thresholds (ETs) and recommended actions (RAs) to be taken up reaching an error threshold. In other embodiments, monitoring parameters 710 includes other parameters. The testing parameters 720 may include parameters such as a set/cycle of one or more tests to be performed, number of iterations of each test, sequence order of tests in the set/cycle, total number of test cycles, error thresholds, and recommended actions upon reaching an error threshold. In other embodiments, testing parameters 720 includes other parameters. In some embodiments, the servicing parameter file 700 specifies default parameters for any storage device types (indicated as "All other disk types" in FIG. 7) not specifically included in the parameter file 700. FIG. 7 shows a conceptual diagram of an exemplary servicing parameters file 700 for illustrative purposes only, and the form in which servicing parameters may be specified in the file 700 may comprise any variety of forms (e.g., specified in entry form, specified in a matrix/array, etc.).

In some embodiments, any of the servicing parameters (e.g., error thresholds, recommended actions, set of tests, iterations of each test, sequence of tests, test cycles, etc.) of the file 700 may vary depending on disk type and/or error type. For example, as shown in FIG. 7, for disk type 1 (which may be defined by a common manufacturer, model, technology type, etc.) and for a recoverable error type, the file 700 may specify an error threshold (ET) of 8 and a recommended action (RA) of disk failure and removal upon reaching the error threshold. In contrast, as shown in FIG. 7, for disk type 2 and for a recoverable error, the file 700 may specify an error threshold (ET) of 4 and a recommended action (RA) of direct disk testing upon reaching the error threshold. Further, as shown in FIG. 7, for disk type 1 and for a timeout error type, the file 700 may specify an error threshold (ET) of 5 and a recommended action (RA) of direct disk testing upon reaching the error threshold. In addition, any of the parameters may vary depending on iteration number or cycle number.

In some embodiments, any of the servicing parameters (e.g., disk type, error type, error thresholds, recommended actions, etc.) may by dynamically modified (i.e., changed, deleted, or added) by simply modifying the servicing parameters file. For example, a new disk type and servicing parameters for the new disk type may be added to the file 700 as, for example, new disk models, new disk technologies, etc. are implemented in the storage systems. As a further example, a new error type may be added to the file 700 as new types of disk errors are determined and defined by engineers.

While servicing the flagged disks 510 according to the parameters file 700, the storage management module 500 may implement a servicing data structure 280 stored in memory 240 to record/track data for properly servicing the flagged disks 510 according to the embodiments described herein. For example, the servicing data structure 280 may be used to record/track particular data for each flagged disk 510, such as the unique identifier of the disk (e.g., disk handle), the disk type, or counters for the number of errors of each particular error type exhibited by the flagged disk 510 during monitoring or testing (whereby a counter for a particular error type is incremented upon each exhibited error of the particular error type). Such data is recorded/tracked for each flagged disk 510, for example, so the storage management module 500 may determine when an error threshold has been reached for a particular error type and to then determine the recommended action upon reaching the error threshold.

B. Monitoring and Testing Modules of the Storage Management Module

In some embodiments, the storage management module 500 comprises a storage health monitor (SHM) module configured for monitoring storage devices 140 and a maintenance center (MC) module configured for testing storage devices 140 of the storage system 200. In these embodiments, the SHM module loads and reads monitoring parameters from an external SHM parameters file and the maintenance center (MC) module loads and reads testing parameters from an external MC parameters file.

In some embodiments, the SHM module may be configured for monitoring disks (referred to herein as "SHM flagged" disks) having disk errors identified by a disk storage (RAID) layer 350 of the storage operating system 300. The SHM module may be configured to monitor performance and disk errors of the SHM flagged disks (as identified and reported by the disk storage layer 350) while the SHM flagged disks are "online" and implemented as storage devices 140 in the storage system 200 (i.e., are still receiving and performing client requests 120). In particular, the SHM module may be configured to receive data 420 (from the disk storage layer 350) regarding an SHM flagged disk and to monitor the disk to determine if an error threshold of any error type (as specified in the SHM parameters file) has been reached. And if so, to determine a recommended action (as specified in the SHM parameters file) to be taken on the SHM flagged disk. In some embodiments, one of the recommended actions specified in the SHM parameters file includes requiring direct testing of the disk by the MC module.

In some embodiments, the MC module may be configured for directly testing disks (referred to herein as "MC flagged" disks) identified by the SHM module as requiring direct testing before a recommended action may be determined for the disks. The MC module may be configured to directly test MC flagged disks (without requiring identification and reporting of disk errors of the disks by the disk storage layer 350) while the disks are "offline" and not implemented as storage devices 140 in the storage system 200 (i.e., are no longer receiving and performing client requests 120). In particular, the MC module may be configured to receive data (from the SHM module) regarding a MC flagged disk determined to require direct testing, to test the MC flagged disk (according to the MC parameters file), and to determine if an error threshold of any error type (specified in the MC parameters file) has been reached during testing. And if so, to determine a recommended action (as specified in the MC parameters file) to be taken on the MC flagged disk.

Figure 8:
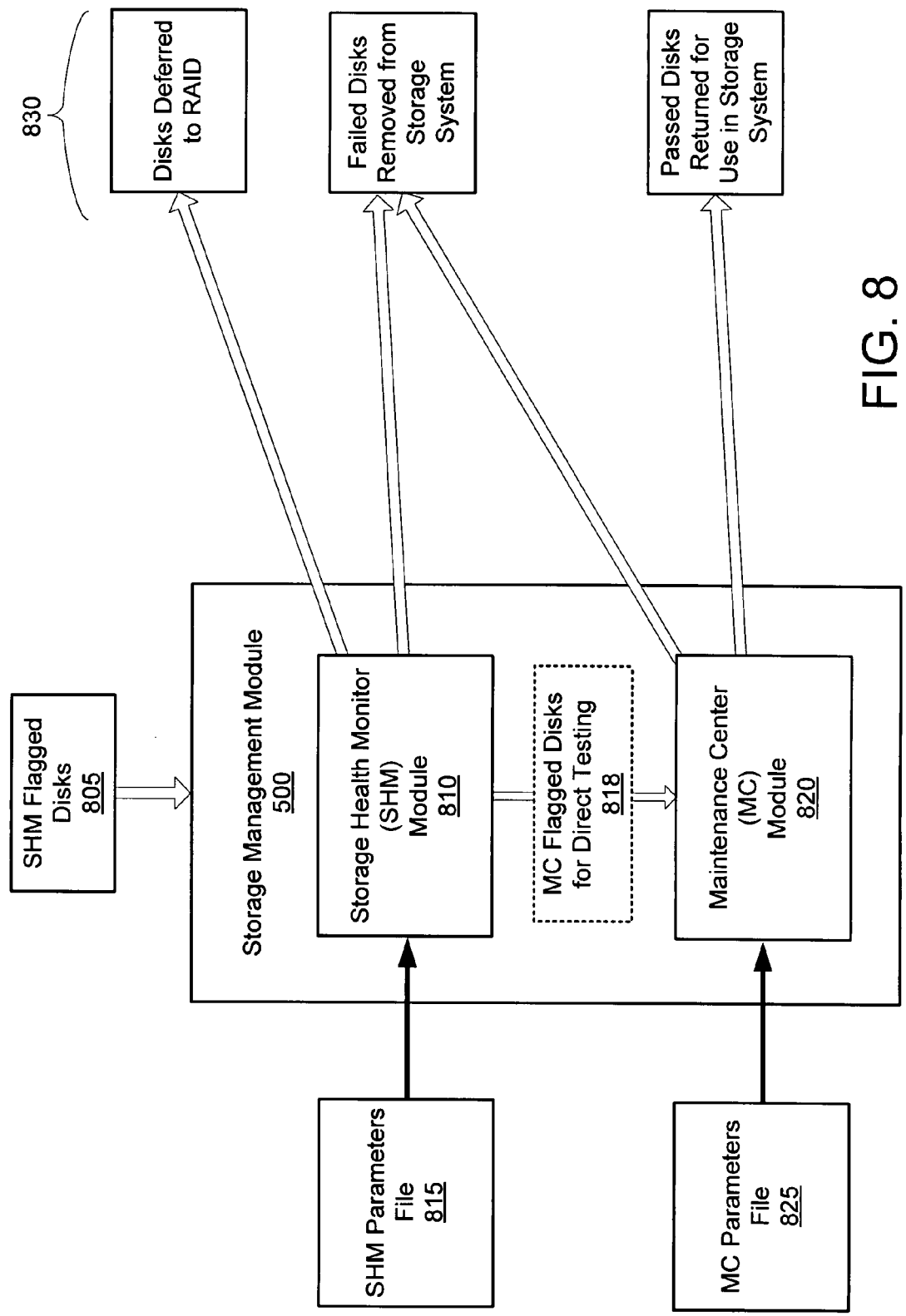
FIG. 8 shows a conceptual diagram of exemplary disk servicing operations of a storage management module comprising a storage health monitor (SHM) module and a maintenance center (MC) module.

FIG. 8 shows a conceptual diagram of exemplary disk servicing operations of a storage management module 500 comprising a storage health monitor (SHM) module 810 and a maintenance center (MC) module 820. The SHM module 810 loads and reads monitoring parameters from an SHM parameters file 815 and monitors an SHM flagged disk 805 according to the SHM parameters file 815 to determine a recommended action for the SHM flagged disk 805. Based on the recommended action, a particular action 830 is ultimately performed on the SHM flagged disk 805. The MC module 820 loads and reads disk testing parameters from an MC parameters file 825 and tests an MC flagged disk 818 according to the MC parameters file 825 to determine a recommended action for the MC flagged disk 818. Based on the recommended action, a particular action 830 is ultimately performed on the MC flagged disk 818.

Note that the SHM parameters file 815 is not encoded as code instructions of the SHM module 810 but is external to the SHM module 810, whereby the SHM module 810 locates (e.g., at a predetermined location) and reads monitoring parameters from the SHM parameters file 815. In some embodiments, the SHM parameters file 815 may comprise monitoring parameters (such as the monitoring parameters 710 shown in the example of FIG. 7) comprising disk types, error types, error thresholds (ETs), and recommended actions (RAs)). In other embodiments, the SHM parameters file 815 includes other parameters. Using the example of FIG. 7, the SHM module 810 may monitor a particular SHM flagged disk 805 being of disk type 2 and receive data 420 regarding disk errors (of various error types) of the disk from the disk storage layer 350. If, for example, the SHM module 810 receives three timeout errors for the disk 805, the SHM module 810 would determine that the recommended action for the disk 805 would be direct testing of the disk 805 by the MC module 820.

In some embodiments, the recommended actions on an SHM flagged disk 805 specified in the SHM parameters file 815 includes deferring the disk to the disk storage (RAID)

layer 350, failing the disk, and requiring direct testing of the disk. When a disk is deferred to the disk storage (RAID) layer 350, the decision on the disk is deferred to the RAID layer 350 which may or may not fail the disk at a later time. Disks given this recommended action are typically performing at a marginal level and may perform client requests for a short time longer until the RAID layer 350 determines to fail the disk. When this recommended action is determined, the SHM module 810 may return this recommendation to the RAID layer 350 to continue using the disk until the RAID layer has the opportunity to safely fail the disk. When a disk is failed, it is removed from use in the storage system. As such, when this recommended action is determined, the SHM module 810 returns the recommendation to the RAID layer 350 to logically remove the disk from the set of disks 140 of the storage system 200. The disk may then be later physically removed from the storage system 200 and returned to the disk manufacturer for repair and/or analysis to determine causes of the failure.

A disk requiring direct testing is to be tested by the MC module 820 and is referred to as a MC flagged disk 818. When this recommended action is determined, the SHM module 810 may return this recommendation to the RAID layer 350 to remove the disk from the set of storage devices 140 in the storage system 200 (e.g., remove the disk from a storage volume or RAID group in which it belongs) so that it no longer receives and performs client requests 120. The SHM module 810 may then send a unique identifier of the MC flagged disk 818 to the MC module 820. Data of the MC flagged disk 818 may also be migrated to a replacement disk before the disk is sent to the MC module 820. The RAID layer 350 may then send a command to the MC module 820 to test the MC flagged disk 818.

The MC module 820 receives a unique identifier of an MC flagged disk 818 and performs testing on the MC flagged disk 818 according to the MC parameters file 825. Note that the MC parameters file 825 is not encoded as code instructions of the MC module 820 but is external to the MC module 820, whereby the MC module 820 locates (e.g., at a predetermined location) and reads testing parameters from the MC parameters file 825. In some embodiments, the MC parameters file 825 may comprise testing parameters (such as the testing parameters 720 shown in the example of FIG. 7) comprising disk types, error types, set/cycle of one or more tests to be performed, number of iterations of each test, sequence order of tests in the set/cycle, total number of test cycles, error thresholds (ETs), recommended actions (RAs). In other embodiments, the MC parameters file 825 includes other parameters.

The set of tests to be performed specify a single cycle of particular tests to be performed on a MC flagged disk 818. The tests that may be performed on a MC flagged disk 818 may include such tests as a self test, a data integrity test, a media scan test, a write test, etc. In other embodiments, the tests performed on a MC flagged disk 818 may comprise other tests. A self test comprises a set of internal disk tests (i.e., disk-resident algorithms) for testing and correcting disk problems. A data integrity test comprises writing data to random areas of the disk and reading the data back to verify the correctness of the data. A media scan test comprises scanning the media surfaces of the disk drives to reduce and manage operating risks from certain disk failure mechanisms. A write test comprises writing data to all locations of the disk to check for errors and remapping and rewriting all bad sectors.

The MC parameters file 825 may also specify a number of iterations of each test to be performed, the sequence order of the tests to be performed during each set/cycle, and a total number of test cycles to be performed on each MC flagged disk 818. The MC parameters file 825 may specify different error thresholds for different error types for different tests. For example, the MC parameters file 825 may specify an error threshold of 4 for recoverable errors and an error threshold of 6 for timeout errors encountered during the data integrity test. The MC parameters file 825 may further specify an error threshold of 5 for recoverable errors and an error threshold of 7 for timeout errors encountered during the media scan test. Also, the MC parameters file 825 may specify different error thresholds for different iterations of each test. For example, the MC parameters file 825 may specify, for recoverable errors, an error threshold of 4 during a first iteration and an error threshold of 2 during a second iteration of the data integrity test. Further, the MC parameters file 825 may specify different error thresholds for different cycles of each test. For example, the MC parameters file 825 may specify, for recoverable errors, an error threshold of 5 during a first cycle and an error threshold of 4 during a second cycle of the data integrity test. As such, the MC parameters file 825 may specify different error thresholds depending on the disk type, error type, test type, iteration number (i.e., error thresholds may be different for different iterations), or the cycle number (i.e., error thresholds may be different for different cycles). A recommended action may also be specified for reaching an error threshold. Recommended actions may include ending all testing immediately and failing the disk ("fail disk"), or continue further testing of the disk (although the current test is considered failed) to collect more data on the disk ("continue testing").

Using the example of FIG. 7, the testing parameters 720 of the MC parameters file 825 specify for a disk type 1 (which may be defined by a common manufacturer, model, technology type, etc.), a cycle of tests to be performed (in sequence) that comprises the data integrity test, the self test, and the media scan test. In accordance with the testing parameters 720, the MC module 820 will perform 1 iteration of the data integrity test and fail an MC flagged disk 818 if 3 recoverable or media errors are encountered during the data integrity test, perform 1 iteration of the self test and fail a MC flagged disk 818 if 2 errors of any error type are encountered during the self test, and perform 3 iterations of the media scan test and fail an MC flagged disk 818 if 4 recoverable or media data errors or 1 timeout or missing errors are encountered in the first iteration, or fail an MC flagged disk 818 if 1 error of any error type is encountered in the second or third iterations. In the example of FIG. 7, the testing parameters 720 further specify that a total of two testing cycles will be performed, whereby the MC module 820 will use the initial error thresholds (discussed above) in the first testing cycle and use the initial error thresholds minus 1 in the second testing cycle for all tests. Note that any of the parameters 720 may vary depending on storage device type or error type and that any of the parameters may also vary depending on iteration number or cycle number.

In some embodiments, if the MC module 820 performs all testing on an MC flagged disk 818 in accordance with the MC parameters file 825 and no error thresholds of any error types are reached, the particular MC flagged disk 818 is considered to have passed testing and may be returned for use in the storage system 200 (e.g., returned to a spare pool of disks). As such, when an MC flagged disk 818 passes testing, the MC module 820 may return a successful status to the RAID layer 350 to use the MC flagged disk 818 in the storage system 200.

Figure 9A:
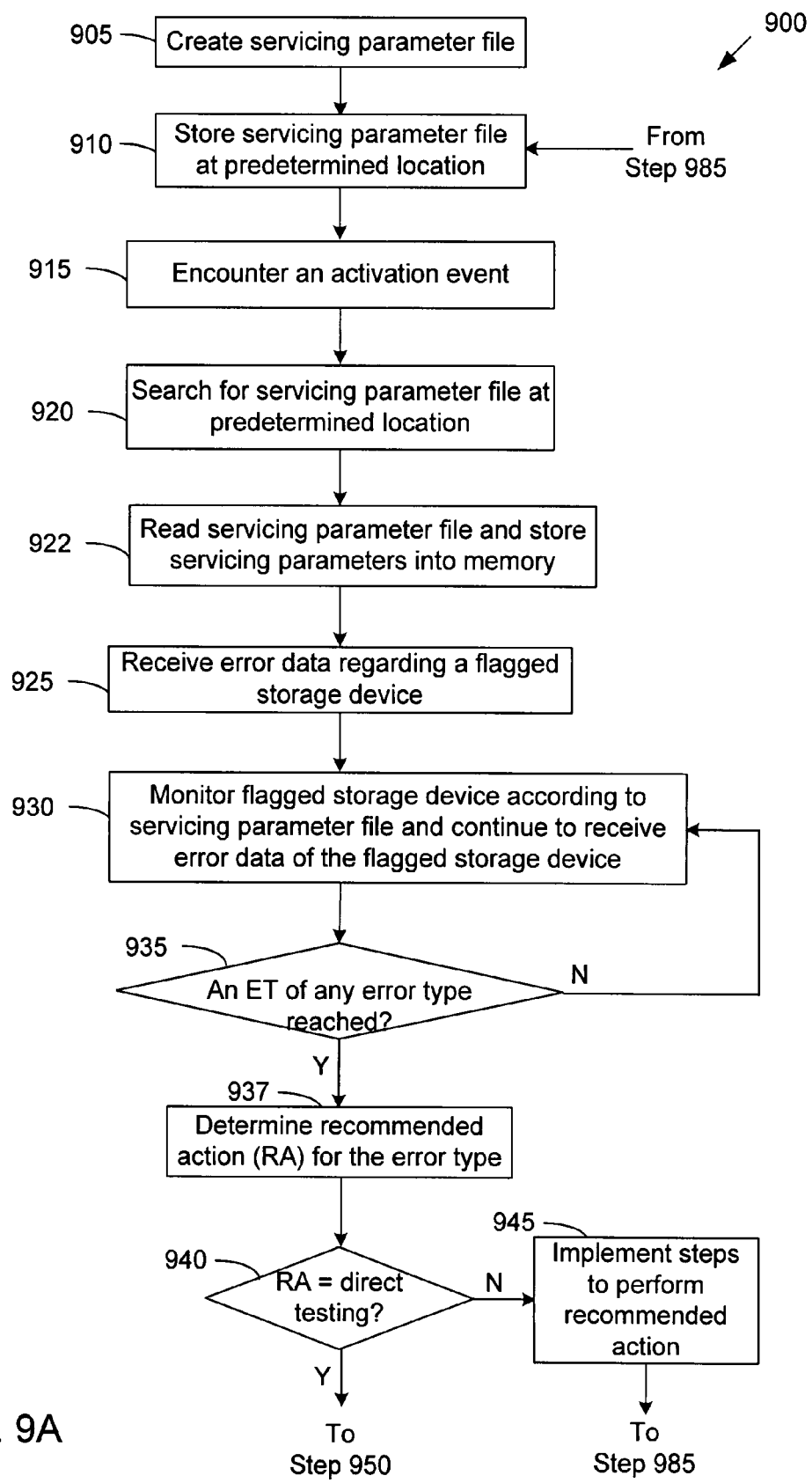
FIGS. 9A-B are flowcharts of a method for dynamically modifying storage device servicing parameters of a storage operating system using a parameters file.
Figure 9B:
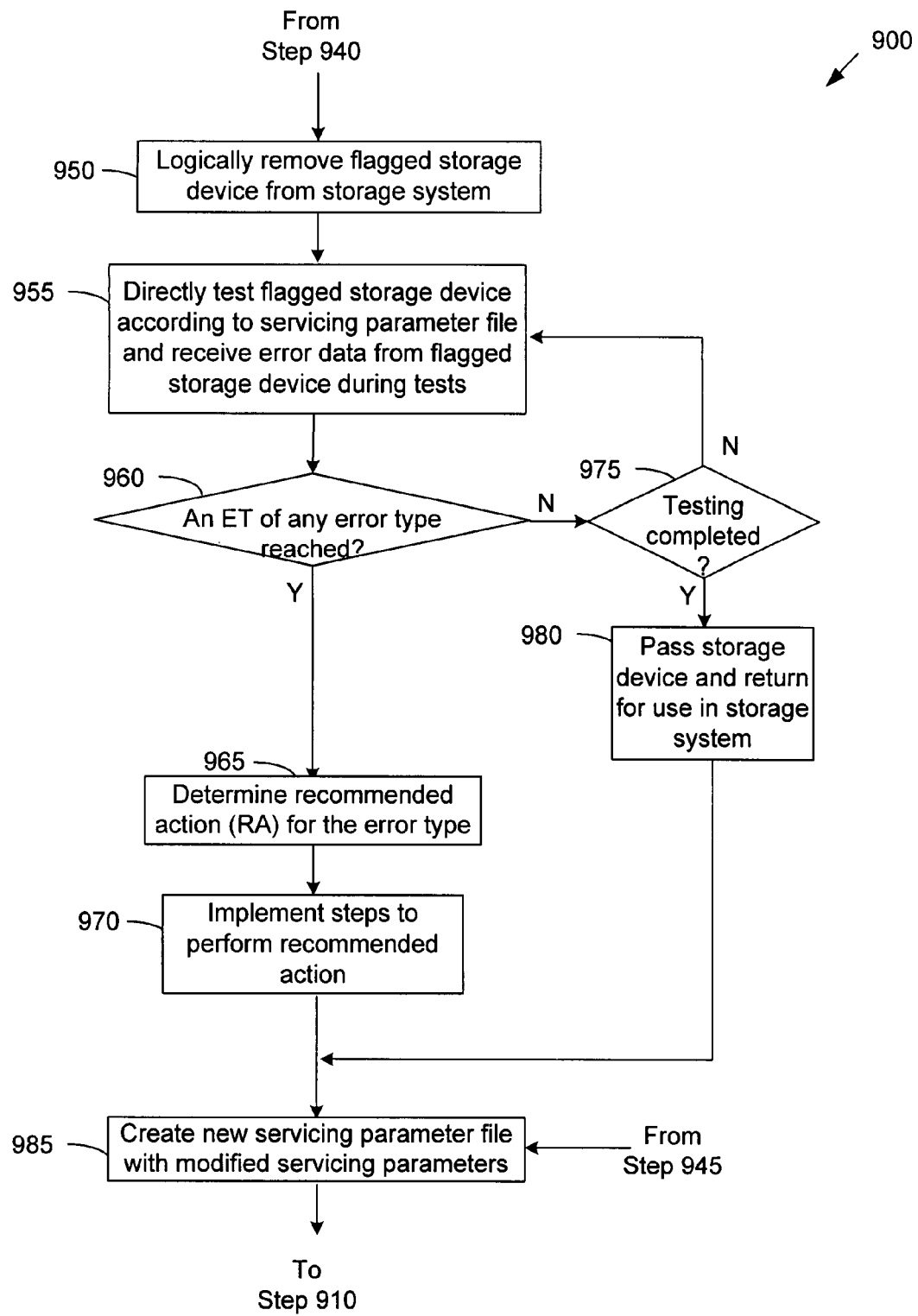

C. Method for Implementing a Storage Management Module Using a Parameters File FIGS. 9A-B are flowcharts of a method 900 for dynamically modifying storage device servicing parameters of a storage operating system 300 using a parameters file 700. The storage operating system 300 comprises a storage management module 500 configured for servicing (e.g., monitoring or testing) a set of storage devices 140 of a storage system 200 in accordance with servicing parameters contained in the parameters file 700. In some embodiments, some of the steps of the method 900 are implemented by software or hardware. In some embodiments, some of the steps of method 900 are performed by the storage management module 500 of the storage operating system 200. The order and number of steps of the method 900 are for illustrative purposes only and, in other embodiments, a different order and/or number of steps are used.

The method 900 begins when a servicing parameter file 700 is created (at 905). In some embodiments, the servicing parameter file 700 contains servicing parameters (e.g., monitoring and/or testing parameters) comprising storage device types, error types, a set/cycle of one or more tests to be performed, number of iterations of each test, sequence order of tests in the set/cycle, total number of test cycles, error thresholds, and recommended actions upon reaching an error threshold. In other embodiments, the servicing parameter file 700 contains other servicing parameters. In some embodiments, the servicing parameters in the file 700 may vary depending on storage device type and/or error type. The parameters may also vary depending on iteration number or cycle number. In some embodiments, the servicing parameter file 700 specifies default parameters for all other storage device types not specifically included in the servicing parameter file 700. In some embodiments, the servicing parameters file 700 may specify different servicing parameters based upon the reason for entry into direct testing.

The servicing parameter file 700 is then stored (at 910) at a predetermined location (e.g., in a directory in the root volume of storage system 200). An activation event is then encountered (at 915) that triggers the storage management module 500 to search (at 920) for the servicing parameter file 700 at the predetermined location. An activation event may comprise any variety of events, such as a startup of the storage operating system 300, the addition of a new servicing parameter file 700 that has been stored to the predetermined location (whereby the storage management module 500 is configured to periodically check/examine the predetermined location to determine whether a new servicing parameter file 700 has been stored there), receiving an administrative command that requests the storage management module 500 to read the servicing parameter file 700, etc.

Upon locating the servicing parameter file 700, the storage management module 500 then reads (at 922) the servicing parameter file 700 and stores the servicing parameters contained in the file 700 into memory (e.g., memory 240 of the storage system 200) for later use by the storage management module 500 in servicing one or more flagged storage devices. By using an external parameter file 700 having servicing parameters for use by the storage management module 500 in servicing storage devices (rather than encoding the parameters into the coding of the storage management module 500), the servicing parameters may be easily modified and read by the storage management module 500 (rather than providing new coding for the storage management module 500 reflecting the modified parameters).

The storage management module 500 then receives (at 925) data regarding a flagged storage device 510 exhibiting an error. In some embodiments, the received data comprises a unique identifier for the flagged storage device, the storage device type, and the error type. The storage management module 500 may receive such data from a storage device storage (RAID) layer 350 of the storage operating system 300. The storage management module 500 then monitors (at 930) the flagged storage device 510 according to the parameters of the servicing parameter file 700 and continues to receive data from the storage device storage layer 350 regarding any errors of the flagged storage device 510.

At step 935, the storage management module 500 determines whether an error threshold (ET) of any error type (as specified in the servicing parameter file 700) has been reached for the flagged storage device 510. If not, the method continues at step 930 (where the storage management module 500 continues to monitor and receive data regarding any errors of the flagged storage device 510). If so, the storage management module 500 then determines (at 937) a recommended action specified (in the servicing parameter file 700) for the error type for which the error threshold has been reached.

The method then determines (at 940) whether the recommended action is direct testing of the flagged storage device 510. If not, the method implements (at 945) steps to perform the recommended action. For example, if the recommended action is deferring the decision to the storage device storage (RAID) layer 350, the storage management module 500 return a status to the RAID layer 350 to continue using the storage device until the RAID layer 350 can safely fail the device. If the recommended action is storage device failure and removal from the storage system, the storage management module 500 may return a status to the RAID layer 350 to logically remove the storage device from the set of storage devices 140 of the storage system 200, and the storage device may be later physically removed from the storage system 200 and returned to the storage device manufacturer for repair and/or analysis. The method 900 then continues at step 985.

If the recommended action is determined (at 940—Yes) to be direct testing of the flagged storage device 510, the storage management module 500 returns a status to the RAID layer 350 to logically remove (at 950) the flagged storage device from the set of storage devices 140 of the storage system 200. After the device is logically removed from the set of storage device 140, the RAID layer 350 sends a command to the storage management module 500 which then directly tests (at 955) the flagged storage device according to the parameters of the servicing parameter file 700. In some embodiments, the servicing parameter file 700 specifies a set of tests to be performed, iterations of each test, sequence order of tests, number of test cycles, error thresholds, and recommended actions upon reaching an error threshold. During testing of the flagged storage device, the storage management module 500 receives (at 955) data from the flagged storage device regarding any errors encountered in performing the tests.

At step 960, the storage management module 500 determines whether an error threshold of any error type (as specified in the servicing parameter file 700) has been reached for the flagged storage device 510 during testing. If not, the method determines (at 975) whether all testing specified in the servicing parameter file 700 has been completed. If not, the method 900 continues at step 955. If so, the flagged storage device 510 has passed testing and the storage management module 500 returns (at 980) a successful status to the RAID layer 350 to use the flagged storage device in the storage system 200. The method then continues at step 985.

If the storage management module 500 determines (at step 960—Yes) that an error threshold of an error type has been reached for the flagged storage device 510, the storage management module 500 determines (at 965) a recommended action specified (in the servicing parameter file 700) for the error type for which the error threshold has been reached. The method then implements (at 970) steps to perform the recommended action. For example, if the recommended action is storage device failure and removal from the storage system, the flagged storage device may be physically removed from the storage system 200 and returned to the storage device manufacturer for repair and/or analysis).

At step 985, a new servicing parameter file is created having modified servicing parameters (e.g., changed, deleted, or added parameters from the original servicing parameter file 700). The parameters of the new servicing parameter file 700 may be based on storage device data collected from the field. The method then continues at step 910 where the new servicing parameter file is stored and then read (at 922) by the storage management module 500. As shown above, the servicing parameters of the parameter file 700 may be easily modified and read by the storage management module 500 for servicing the storage devices (rather than creating new code instructions for the storage management module 500 reflecting the modified parameters and installing a new version of the storage operating system 300, as conventionally done).

IV. Reporting Module for Providing Storage Device and Storage System Data

A. Reporting Module

Figure 10:
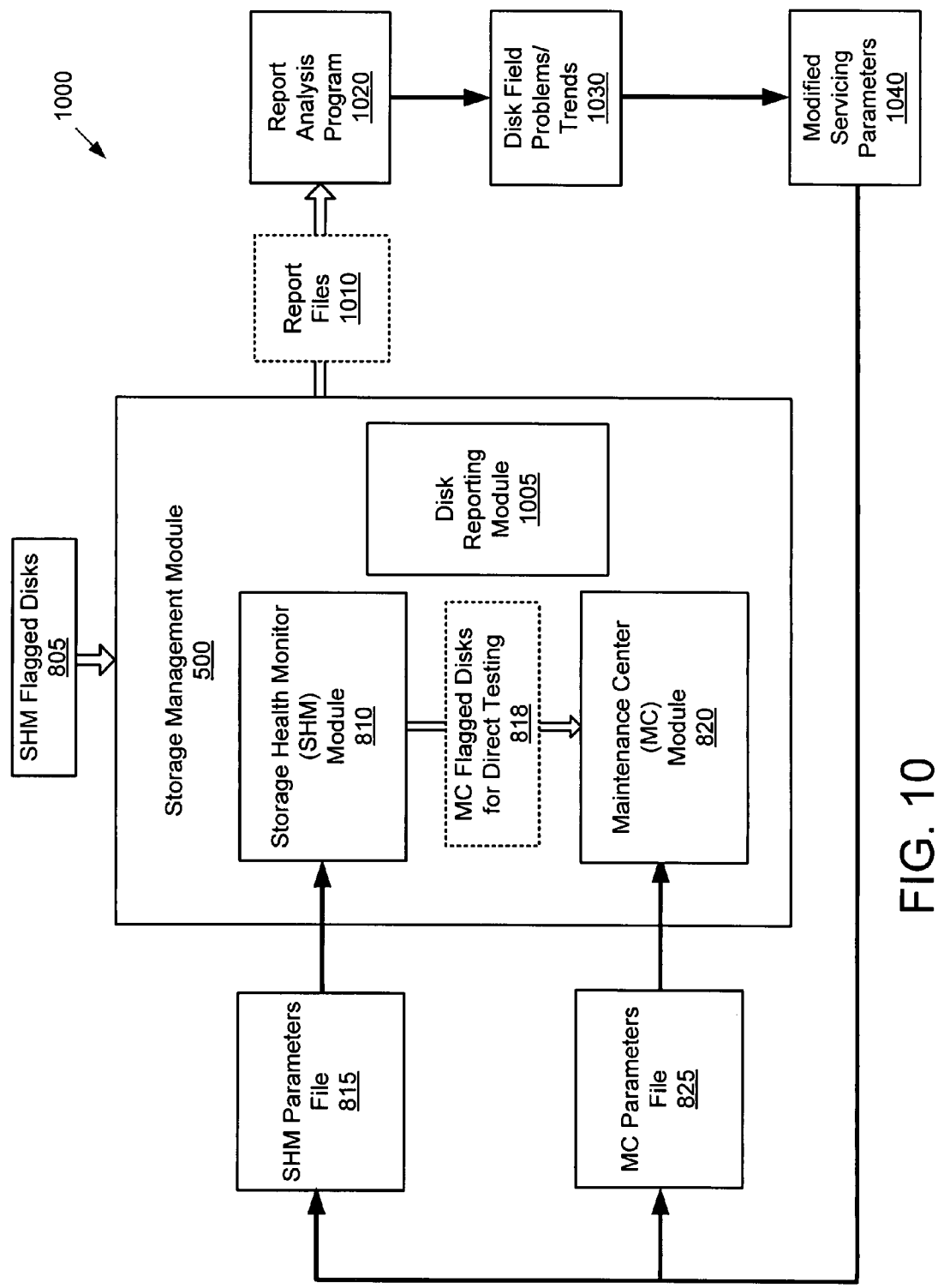
FIG. 10 shows a conceptual diagram of a reporting system in which some embodiments of a reporting module may be implemented.

In some embodiments, the storage management module also includes a reporting module for providing storage device and storage system data. FIG. 10 shows a conceptual diagram of a reporting system 1000 in which some embodiments of the reporting module may be implemented. The reporting system 1000 includes the storage management module 500 comprising a storage health monitor (SHM) module 810 that monitors SHM flagged disks 805 according to an SHM parameters file 815 and a maintenance center (MC) module 820 that tests MC flagged disks 818 according to an MC parameters file 825. The SHM flagged disks 805 and MC flagged disks 818 may be referred to herein as "serviced" disks. The reporting system 1000 also includes a reporting module 1005 that may provide storage device or storage system data in the form of one or more report files 1010. The report files 1010 are sent to a report analysis program 1020 that receives and automatically processes the report files 1010 to determine field problems or trends 1030 regarding storage devices or storage systems. The determined field problems or trends 1030 may then be used to determine modified servicing parameters 1040 that may be used by storage management module 500 to service storage devices.

In some embodiments, the reporting module 1005 creates, for each disk serviced by the storage management module 500, a report file 1010 for storing collected data regarding the serviced disk and the storage system 200. In some embodiments, the reporting module 1005 collects serviced disk data and/or storage system data upon the occurrence of a predetermined event and stores the collected data to the report file 1010. In these embodiments, a predetermined event comprises an event that may vary in time when it occurs and does not comprise the occurrence of a predetermined time interval (e.g., a regularly scheduled collection of data). In some embodiments, a predetermined event comprises when a disk first exhibits errors and the SHM module 810 begins monitoring of the disk, when monitoring of the disk ends and the MC module 820 begins testing of the disk, or when testing of the disk ends. Note that for each of such events, the time when each event occurs may vary in time (i.e., is not based on a predetermined schedule). In other embodiments, a predetermined event comprises another event.

As discussed above in relation to FIGS. 6 and 8, when a disk (SHM flagged disk 805) first exhibits errors, the storage management module 500 may begin servicing the disk (the SHM module 810 begins monitoring the disk) and start storing servicing data regarding the disk to a servicing data structure 280. This event may be referred to herein as when monitoring of the disk begins. In some embodiments, when monitoring of a particular disk begins, the reporting module 1005 may create a report file 1010 for the particular disk and begin to collect and store data regarding the particular disk and the storage system 200 to the report file 1010.

As discussed above in relation to FIG. 8, the SHM module 810 monitors a disk (SHM flagged disk 805) according to the SHM parameters file 815 to determine a recommended action for the disk. As such, monitoring of the disk ends when a recommended action for the disk is determined by the SHM module 810. This event may be referred to herein as when monitoring of the disk ends. In some embodiments, when monitoring of a particular disk ends, the reporting module 1005 may collect and store disk monitoring data relating to the particular disk and/or storage system data to the report file 1010.

In some embodiments, if the recommended action for a particular disk (SHM flagged disk 805) determined by the SHM module 810 does not comprise direct testing of the disk by the MC module 820 (e.g., deferring the disk to the disk storage layer 350, or failing the disk), further data is not collected for the particular disk and the report file 1010 for the particular disk is complete (and may be then formatted into a predetermined format and sent to the report analysis program 1020). If, however, the recommended action for a particular disk (SHM flagged disk 805) determined by the SHM module 810 does comprise direct testing of the disk by the MC module 820, the report file 1010 for the particular disk is not complete and data continues to be collected for the particular disk.

As discussed above in relation to FIG. 8, the MC module 820 tests a disk (MC flagged disk 818) according to the MC parameters file 825 to determine a recommended action for the disk. As such, testing of the disk ends when a recommended action for the disk is determined by the MC module 820. This event may be referred to herein as when testing of the disk ends. In some embodiments, when testing of a particular disk ends, the reporting module 1005 may collect and store disk testing data relating to the particular disk and/or storage system data to the report file 1010. The report file 1010 for the particular disk may then be formatted into a predetermined format and sent to the report analysis program 1020.

Upon the occurrence of a predetermined event, the reporting module 1005 may collect and store to a report file 1010 data regarding a particular disk from the servicing data structure 280 (contained in memory 240) to which the storage management module 500 stored data during servicing of the disk. For example, while monitoring an SHM flagged disk 805, the SHM module 810 may store monitoring data for the disk, such as the number of errors of various error types exhibited by the disk. Also, while monitoring an MC flagged disk 818, the MC module 820 may store testing data collected for the disk, such as the number of errors of various error types exhibited by the disk during direct testing.

FIG. 11 shows a conceptual diagram of the exemplary contents of a servicing data structure 280 in accordance with some embodiments. In the example of FIG. 11, the servicing data structure 280 contains, for each of a plurality of serviced disks, an unique identifier 1105 (e.g., "X," "Y," etc.) and disk type of the serviced disk, monitoring data 1110, and testing data 1120. The monitoring data 1110 may be collected by the SHM module 810 while monitoring the serviced disk. In the example of FIG. 11, the monitoring data 1110 may include counters for the number of errors of various error types exhibited during monitoring of the serviced disk. The monitoring data 1110 may be collected by the reporting module 1005 and stored to the report file 1010 for the serviced disk when monitoring of the serviced disk ends (a predetermined event). The testing data 1120 may be collected by the MC module 820 while testing the serviced disk. In the example of FIG. 11, the testing data 1120 may include counters for the number of errors of various error types exhibited during direct testing of the serviced disk (wherein different counters may be used for different test iterations or test cycles). The testing data 1120 may be collected by the reporting module 1005 and stored to the report file 1010 for the serviced disk when testing of the serviced disk ends (a predetermined event). In other embodiments, other data regarding the servicing of disks is stored to the servicing data structure 280 and collected by the reporting module 1005.

In some embodiments, upon the occurrence of a predetermined event, the reporting module 1005 may also collect data regarding a particular disk from the disk itself. In these embodiments, one or more disks 140 implemented in the storage system 200 may comprise disks that implement Self Monitoring Analysis and Reporting Technology (SMART) to collect data about themselves (such as error rates for various error types) into drive logs stored on the disks. For such a disk, the reporting module 1005 may extract data from its drive log (e.g., by sending a command to the disk to read and send data from the drive log) and include the received data in a report file 1010 for the disk.

Upon the occurrence of a predetermined event, the reporting module 1005 may also collect data regarding the storage system 200 in which a particular disk is implemented. The storage system data may comprise information regarding the configuration or operating state/status of the storage system. The storage system data may be collected from the storage operating system 300, subsystems of the storage operating system (e.g., storage controller drivers), or by sending commands to various components in the storage system 200 (e.g., shelf controllers, bridges, switches, etc.). As such, the collected storage system data reflects the configuration or operating state/status of the storage system when a predetermined event occurred (e.g., when a disk first encountered errors and begins being serviced, etc.). Such storage system data may be relevant for diagnosing errors of a particular disk and in determining disk or storage system trends (rather than storage system information collected at a predetermined time interval, as conventionally done). Examples of storage system data that may be collected include storage system manufacturer, model, or version, installed storage adapter types, log information from adapter drivers, fibre channel (FC) switch models, configuration of switches, drive shelf types, log information from drive shelves (e.g., configuration, firmware version, or error logs), presence of any bridges, bridge types (e.g., FC-ATA bridge), bridge firmware versions, log information from any bridges, SCSI Enclosure Services (SES) information, etc. In other embodiments, other storage system data is collected.

B. Report File Format

In some embodiments, for each serviced disk, the reporting module 1005 may save collected disk and/or storage system data to a report file 1010 in a predetermined format. For each report file 1010, the predetermined format may specify a particular ordering of data according to data type and may specify a particular ordering of data into two or more sections, each section containing a particular type of related data (data type). For example, each report file 1010 may comprise three sections: a header section, a disk data section, and a storage system data section. For each report file 1010, the predetermined format may further specify one or more sub-sections of a data type section. By saving the collected disk and/or storage system data to a report file 1010 in a predetermined format, the report file may be easily processed by the report analysis program 1020 which has knowledge of the predetermined format.

Figure 12:
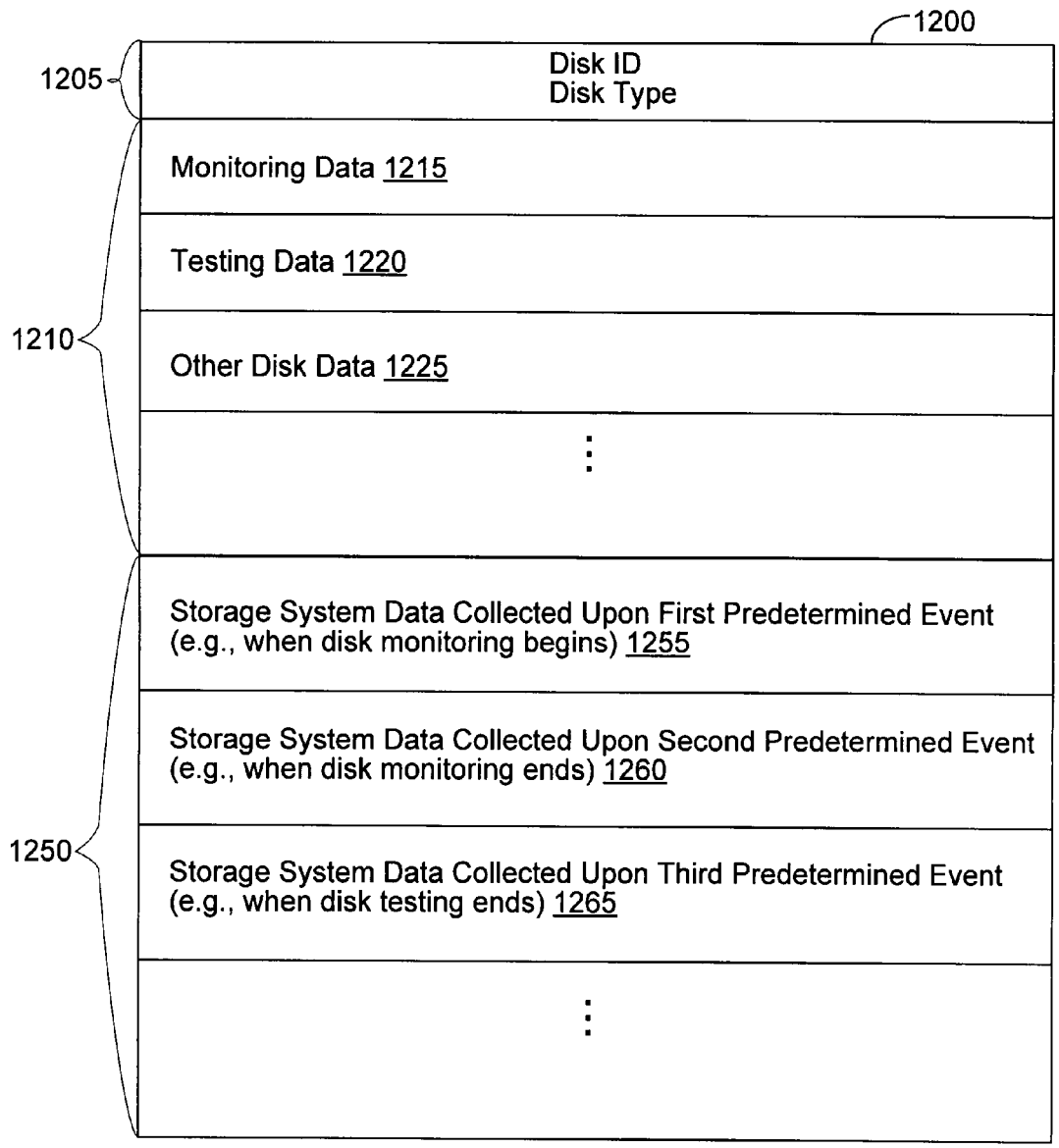
FIG. 12 shows a conceptual diagram of an exemplary report file having an exemplary predetermined format.

FIG. 12 shows a conceptual diagram of an exemplary report file 1200 for a serviced disk, the report file 1200 containing disk and storage system data organized into an exemplary predetermined format. In the example of FIG. 12, the report file 1200 is formatted into a header section 1205, a disk data section 1210, and a storage system data section 1220. The header section 1205 may comprise an unique identifier and disk type of the serviced disk. The disk data section 1210 may comprise one or more sub-sections of related disk data. In some embodiments, the sub-sections of disk data comprise monitoring data 1215, testing data 1220, and other disk data 1225. The monitoring data 1215 may comprise the monitoring data 1110 contained in the servicing data structure 280 collected by the SHM module 810 and the testing data 1220 may comprise the testing data 1120 contained in the servicing data structure 280 collected by the MC module 820 for a particular serviced disk. The other disk data 1225 may comprise data extracted from a drive log of a serviced disk. In other embodiments, the disk data section 1210 contains other disk data.

The storage system data section 1250 may also comprise one or more sub-sections of related disk data. In some embodiments, the sub-sections of storage system data comprise storage system data collected upon the occurrence of different predetermined events, such as a first 1255, second 1260, and third 1260 predetermined events. The first predetermined event 1255 may comprise when monitoring of a disk begins, the second predetermined event 1260 may comprise when monitoring of a disk ends, and the third predetermined event 1265 may comprise when testing of a disk ends. In other embodiments, the storage system data section 1250 contains storage system data collected upon the occurrence of other predetermined events.

C. Report Analysis Program

The reporting module 1005 may store the report files 1010 to a predetermined location (e.g., in a directory in the root volume of storage system 200). The reporting module 1005 may be configured to send all report files 1010 stored at the predetermined location to the report analysis program 1020 at a predetermined time interval (e.g., once every week). In other embodiments, the reporting module 1005 may be configured to send a report file 1010 to the report analysis program 1020 upon completing the report file 1010 for a particular disk (e.g., after monitoring or testing of the particular disk ends).

In some embodiments, for each disk tested by the MC module 820, the reporting module 1005 also creates and stores a tracking file to the predetermined location. The tracking file may include a counter that indicates the number of times the disk has entered the MC module 820 for testing, the counter being incremented upon each entrance. The MC module 820 may be configured to automatically fail a disk that enters the MC module 820 for testing a certain number of times. For example, the MC module 820 may be configured to automatically fail a disk that enters the MC module 820 for testing twice.

Referring back to FIG. 10, the report files 1010 (formatted according to a predetermined format) are received by the report analysis program 1020 (which has knowledge of the predetermined format) and automatically (without human intervention) processes and extracts data in the report files 1010 according to the predetermined format. The report analysis program 1020 may use the report files 1010 to determine field problems 1030 with individual storage device types, storage devices, or storage systems, or general trends 1030 across multiple storage device types or multiple storage systems. In some embodiments, the report analysis program 1020 may store data from the report files 1010 to a data collection/database that documents disk errors and trends. The report analysis program 1020 may be resident on a computer system external to the storage system 200 that is connected to the storage system 200 via a network 100. In other embodiments, the report analysis program 1020 may be resident on the storage system 200 (e.g., resident in memory 240 and executed by the processor 220).

The determined field problems and trends 1030 may be used to understand potential problems before they occur and recommend changes in the servicing of the disks to improve disk performance in the field. In some embodiments, the determined field problems or trends 1030 may be used to determine modified servicing parameters 1040 that are used by storage management module 500 to provide optimal servicing of disks. In some embodiments, modified monitoring parameters may be included in a new SHM parameter file 815 that is read by the SHM module 810 to monitor SHM flagged disks 805 and modified testing parameters may be included in a new MC parameter file 825 that is read by the MC module 820 to test MC flagged disks 818.

As shown above, by providing disk and storage system data collected upon the occurrence of predetermined events (such as when disk errors occurred and disks were serviced), data relevant to disk error analysis may be provided (rather than collecting disk and storage system data at a predetermined time interval when such relevant data may be gone, as conventionally done). Also, by providing disk and storage system data in a report file 1010 in a predetermined format, the disk and storage system data may be ordered and organized in related sections (rather than sending disk and storage system data randomly interspersed in a file, as conventionally done). As such, the report files 1010 may be easily processed by a single program (report analysis program 1020) configured to automatically parse and extract the data in the report files 1010 according to the predetermined format (rather than examining the data manually or creating specific scripts for searching specific data, as conventionally done). Therefore, analysis of disk and storage systems can be conveniently performed to determine disk problems or trends 1030 and to determine modified servicing parameters 1040 for providing optimal servicing of disks.

D. Methods for Reporting Storage Device and Storage System Data

Figure 13A:
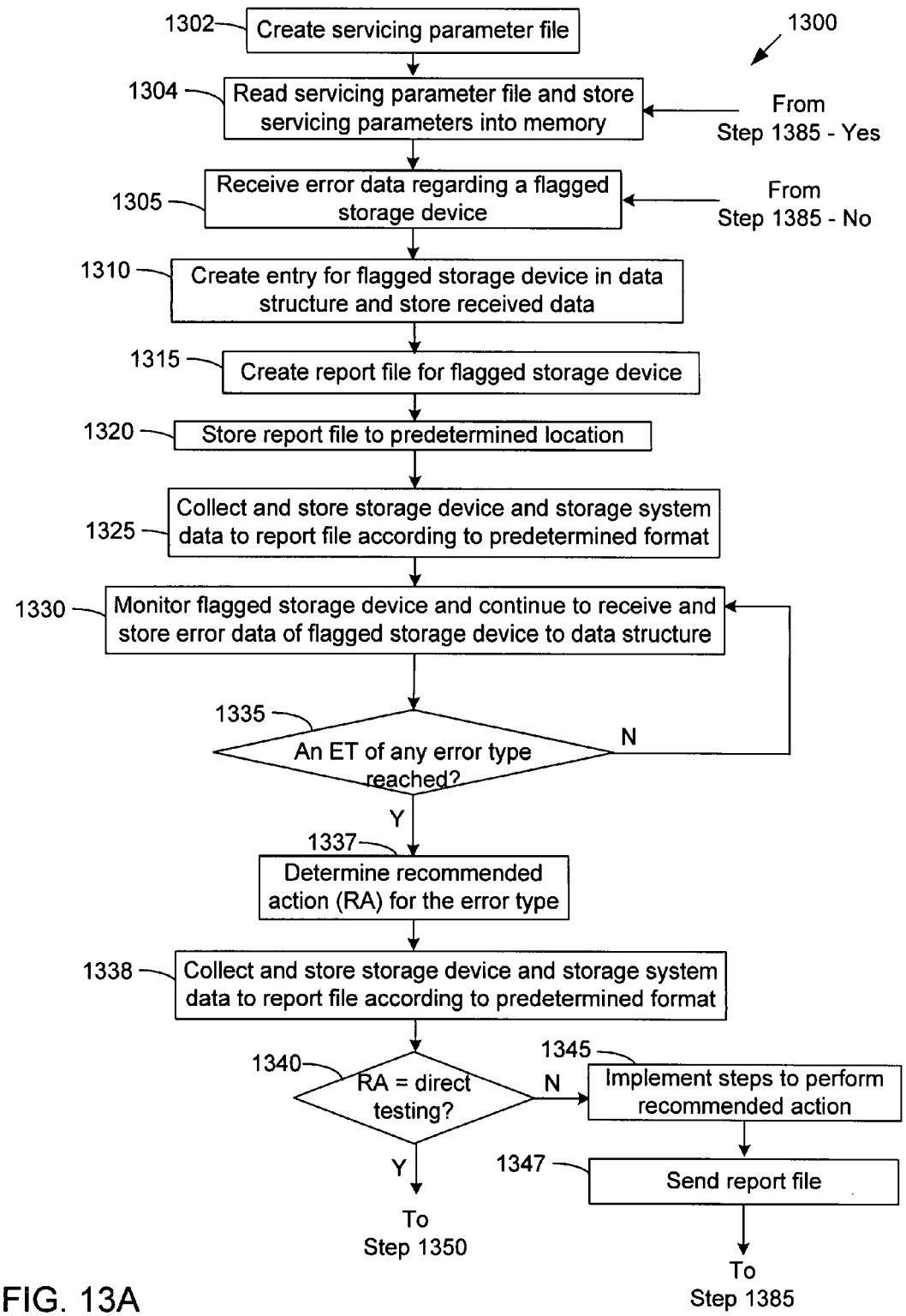
FIGS. 13A-B are flowcharts of a method for reporting data regarding a storage system.
Figure 13B:
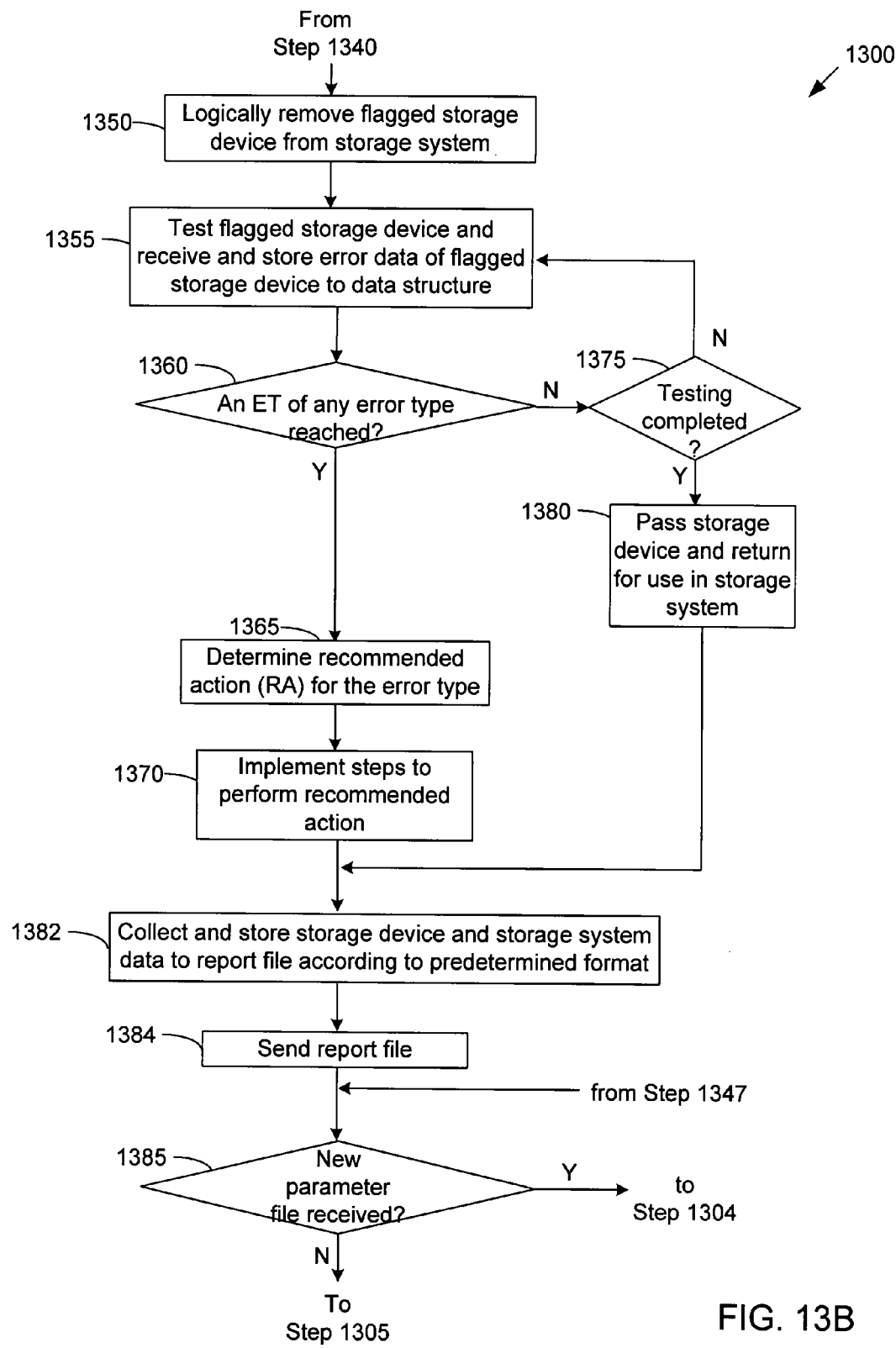

FIGS. 13A-B are flowcharts of a method 1300 for reporting data regarding a storage system 200 comprising a set of one or more storage devices 140. The storage system 200 comprises a storage operating system 200 comprising a storage management module 500 configured for servicing (e.g., monitoring or testing) the storage devices 140 in accordance with a parameters file 700. The storage system 200 further comprises a reporting module 1005 configured for reporting data regarding serviced storage devices 140 and the storage system 200. In some embodiments, some of the steps of the method 1300 are implemented by software or hardware. In some embodiments, some of the steps of method 1300 are performed by the reporting module 1005 of the storage management module 500. The order and number of steps of the method 1300 are for illustrative purposes only and, in other embodiments, a different order and/or number of steps are used.

The method 1300 begins when a servicing parameter file 700 is created (at 1302), the servicing parameter file 700 containing servicing parameters (e.g., monitoring and/or testing parameters). The storage management module 500 then reads (at 1304) the servicing parameter file 700 and stores the servicing parameters into memory (e.g., memory 240 of the storage system 200) for later use by the storage management module 500 in servicing one or more flagged storage devices 510. The storage management module 500 then receives (at 1305) data regarding a flagged storage device 510 exhibiting an error. In some embodiments, the received data comprises a unique identifier for the flagged storage device, the storage device type, and the error type. The storage management module 500 may receive such data from a storage device storage (RAID) layer 350 of the storage operating system 300. The storage management module 500 then creates (at 1310) an entry for the flagged storage device 510 in a servicing data structure 280 (e.g., stored in memory 240 and stores the received data for the flagged storage device 510 in the entry.

Upon receiving the data (at step 1305), the reporting module 1005 of the storage management module 500 also creates (at 1315) a report file 1010 for the flagged storage device 510. The report file 1010 may be stored (at 1320) to a predetermined location (e.g., in a directory in the root volume of storage system 200). The reporting module 1005 then collects and stores (at 1325) data regarding the flagged storage device 510 and the storage system 200 to the report file 1010 according to a predetermined file format. Data regarding the flagged storage device 510 may be collected from the entry for the flagged storage device 510 in the servicing data structure 280 and/or from the flagged storage device 510 itself from its drive log (e.g., if the flagged storage device 510 implements SMART technology). The storage system data may comprise information regarding the configuration or operating state/status of the storage system (e.g., storage system manufacturer, model, or version, storage adapter types, log information from adapter drivers, switch models, etc.) and may be collected from the storage operating system 300, subsystems of the storage operating system (e.g., storage controller drivers), or by sending commands to various components in the storage system 200 (e.g., shelf controllers, bridges, switches, etc.). Therefore, data regarding the flagged storage device 510 and the storage system 200 is collected when the flagged storage device 510 first exhibits errors (and monitoring of the flagged storage device 510 begins). As such, the collected data comprises timely and relevant data important for storage device error analysis.

The storage management module 500 then monitors (at 1330) the flagged storage device 510 according to the parameters of the servicing parameter file 700 and continues to receive error data from the storage device storage layer 350 (regarding any errors of the flagged storage device 510) and store the received error data to the servicing data structure 280 (which is illustrated as monitoring data 1110 in the exemplary servicing data structure of FIG. 11). At step 1335, the storage management module 500 determines whether an error threshold (ET) of any error type (as specified in the servicing parameter file 700) has been reached for the flagged storage device 510. If not, the method continues at step 1330 (where the storage management module 500 continues to monitor, receive, and store error data of the flagged storage device 510 to the servicing data structure 280). If so, the storage management module 500 then determines (at 1337) a recommended action specified (in the servicing parameter file 700) for the error type for which the error threshold has been reached.

When the recommended action for the flagged storage device 510 is determined (at 1337), monitoring of the flagged storage device 510 has ended. As such, the reporting module 1005 then collects and stores (at 1338) data regarding the flagged storage device 510 and the storage system 200 to the report file 1010 according to the predetermined file format. Data regarding the flagged storage device 510 may be collected from the entry for the flagged storage device 510 in the servicing data structure 280 (e.g., comprising monitoring data 1110) and/or from the flagged storage device 510 itself from its drive log.

The method then determines (at 1340) whether the recommended action is direct testing of the flagged storage device 510. If not, the method implements (at 1345) steps to perform the recommended action (e.g., defer the decision to the storage device storage layer 350, fail and remove from the storage system 200, etc.). If the recommended action is not direct testing of the flagged storage device 510, servicing of the flagged storage device 510 has ended and the report file 1010 for the flagged storage device 510 is complete. As such, the reporting module 1005 may then send (at 947) the report file 1010 to the report analysis program 1020 for processing. In other embodiments, the reporting module 1005 may send all report files 1010 stored to the predetermined location on a regular time schedule (e.g., every week) to the report analysis program 1020 for processing. The method 1300 then continues at step 1385.

If the recommended action is determined (at 1340—Yes) to be direct testing of the flagged storage device 510, servicing of the flagged storage device 510 is not completed. The flagged storage device 510 is then logically removed (at 1350) from the set of storage devices 140 of the storage system 200. The storage management module 500 then directly tests (at 1355) the flagged storage device 510 (according to the parameters of the servicing parameter file 700), receives data from the flagged storage device regarding any errors encountered in performing the tests, and stores the received error data to the servicing data structure 280 (which is illustrated as testing data 1120 in the exemplary servicing data structure of FIG. 11).

At step 1360, the storage management module 500 determines whether an error threshold of any error type (as specified in the servicing parameter file 700) has been reached for the flagged storage device 510 during testing. If not, the method determines (at 1375) whether all testing specified in the servicing parameter file 700 has been completed. If not, the method 1300 continues at step 1355. If so, the flagged storage device 510 has passed testing and the flagged storage device is returned (at 980) for use in the storage system 200. At this point, testing and servicing of the flagged storage device has ended. The method then continues at step 1382.

If the storage management module 500 determines (at step 1360—Yes) that an error threshold of an error type has been reached for the flagged storage device 510, the storage management module 500 determines (at 1365) a recommended action specified (in the servicing parameter file 700) for the error type for which the error threshold has been reached. The method then implements (at 1370) steps to perform the recommended action (e.g., fail and remove the flagged storage device). The reporting module 1005 then collects and stores (at 1382) data regarding the flagged storage device 510 and the storage system 200 to the report file 1010 according to the predetermined file format. Data regarding the flagged storage device 510 may be collected from the entry for the flagged storage device 510 in the servicing data structure 280 (e.g., comprising testing data 1120) and/or from the flagged storage device 510 itself from its drive log. At this point, testing and servicing of the flagged storage device has ended and the report file 1010 for the flagged storage device 510 is complete. As such, the reporting module 1005 may then send (at 984) the report file 1010 to the report analysis program 1020 for processing. In other embodiments, the reporting module 1005 may send all report files 1010 stored to the predetermined location on a regular time schedule.

The method 1300 then determines (at 1385) whether a new servicing parameter file 700 having modified servicing parameters has been received. If so, the method continues at step 1304 where the storage management module 500 reads the new servicing parameter file 700. If not, the method continues at step 1305 where the storage management module 500 receives data regarding a flagged storage device 510 exhibiting an error. As such, the method 1300 continues to service storage devices and produce report files 1010 for the storage devices.

As described above, storage device and storage system data are collected and stored to the report file 1010 when storage device errors occur and storage devices are serviced. As such, the collected data comprises timely and relevant data important for storage device error analysis. Also, by providing storage device and storage system data in a report file 1010 in a predetermined format, the data may be ordered and organized in related sections (rather than sending storage device and storage system data randomly interspersed in a file, as conventionally done). As such, the report files may be processed by a single program (report analysis program) configured to automatically process the report files according to the predetermined format.

Figure 14:
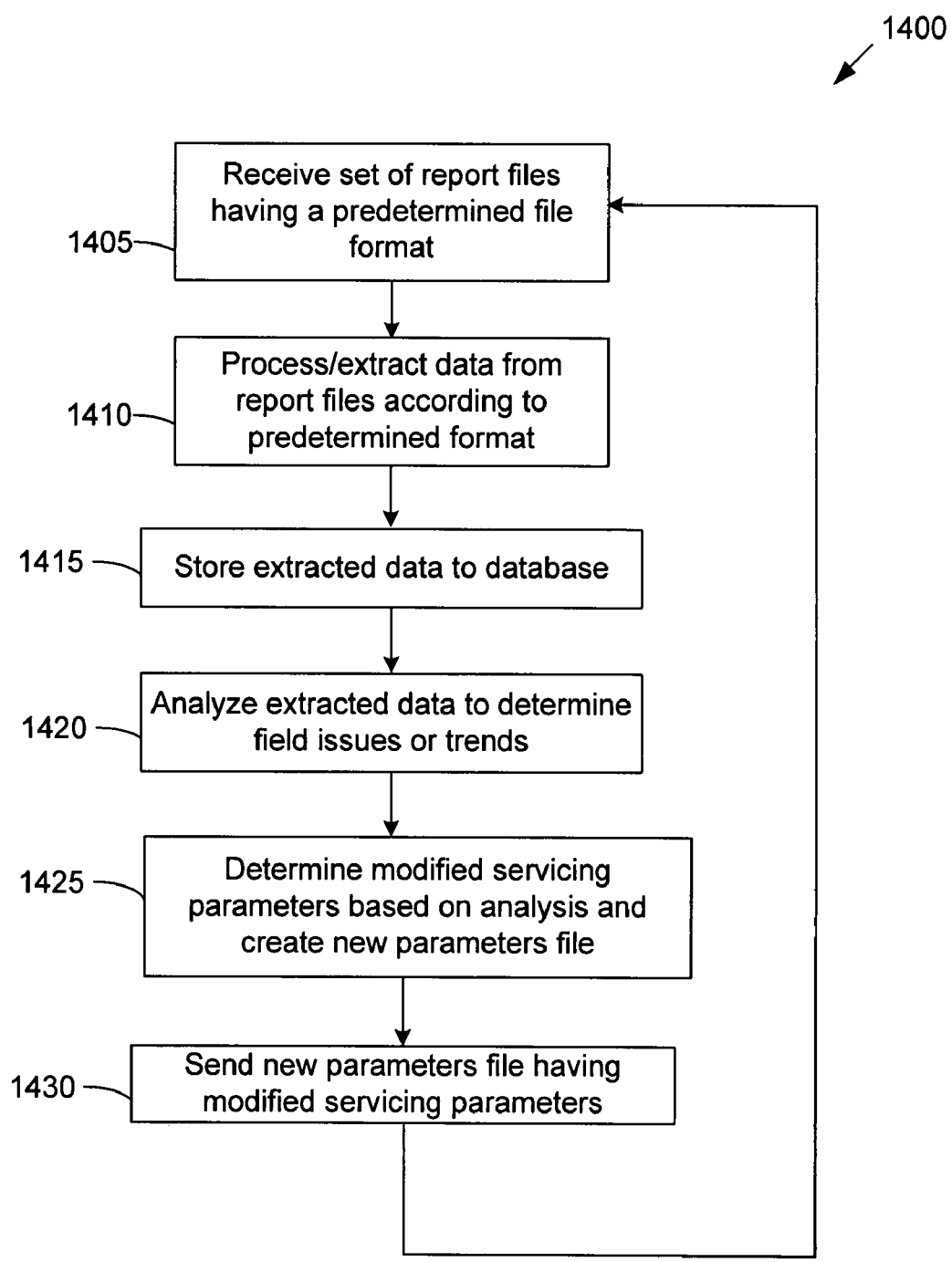
FIG. 14 is a flowchart of a method for automatically processing report files received from a storage system.

FIG. 14 is a flowchart of a method 1400 for automatically processing report files 1010 received from a storage system 200 comprising a set of one or more storage devices 140. The storage system 200 comprises a storage operating system 200 comprising a storage management module 500 configured for servicing (e.g., monitoring or testing) the storage devices 140 in accordance with servicing parameters contained in a parameters file 700. The storage system 200 further comprises a reporting module 1005 configured for sending report files 1010 containing data regarding serviced storage devices 140 and the storage system 200. In some embodiments, some of the steps of the method 1400 are implemented by software or hardware. In some embodiments, some of the steps of method 1400 are performed by a report analysis program 1020. The report analysis program 1020 may reside and execute on the storage system 200 or may reside and execute on a computer system that is external to the storage system 200 (and connected to the storage system 200 via a network). The order and number of steps of the method 1400 are for illustrative purposes only and, in other embodiments, a different order and/or number of steps are used.

The method 1400 begins the report analysis program 1020 receives (at 1405) a set of one or more report files 1010 from the reporting module 1005, each report file 1010 containing storage device and/or storage system data organized in a predetermined format (e.g., specifying two or more sections of related data). In some embodiments, the predetermined format specifies an ordering of data (e.g., specifies a first section containing storage device data and a second section containing storage system data). The report analysis program 1020 then automatically processes (at 1410) the set of report files 1010 according to the predetermined format. For example, the report analysis program 1020 may automatically parse/extract data of the set of report files 1010 according to the predetermined format. The report analysis program 1020 then stores (at 1415) the extracted data to a data collection/database for documenting storage device errors and trends.

The data extracted from the set of report files 1010 is then analyzed (at 1420) to determine issues with individual storage device types, storage devices, or storage systems, or general trends across multiple storage device types or multiple storage systems. Based on the data analysis, a set of modified servicing parameters is determined (at 1425) and a new parameters file 700 is created containing the modified servicing parameters. The new parameters file 700 is then sent (at 1430) to the storage management module 500 which reads the modified servicing parameters of the new parameters file 700 and services the storage devices 140 in accordance with the modified servicing parameters. The method 1400 then continues at step 1405.

By providing report files 1010 having a predetermined format, the report files 1010 may be automatically processed and extracted by a single program (report analysis program) and analysis of storage devices and storage systems can be conveniently performed to determine storage device field issues and trends. The determined issues and trends may then be used to modify servicing parameters to provide optimal servicing of storage devices in the field.

V. Evaluating and Repairing Storage Device Errors Considering Error Localization A. Evaluation Module Conventionally, when the storage management module 500 encounters errors of a flagged storage device 510 during servicing (e.g., monitoring or testing) of the device, it counts each received error in determining whether the flagged storage device 510 has reached an error threshold (e.g., if 8 errors are received, 8 errors are counted against the error threshold). Often, however, multiple errors received from a storage device are due to a single localized physical defect on the storage device (e.g., a small scratch or foreign particle on a platter of the storage device).

Figure 16A:
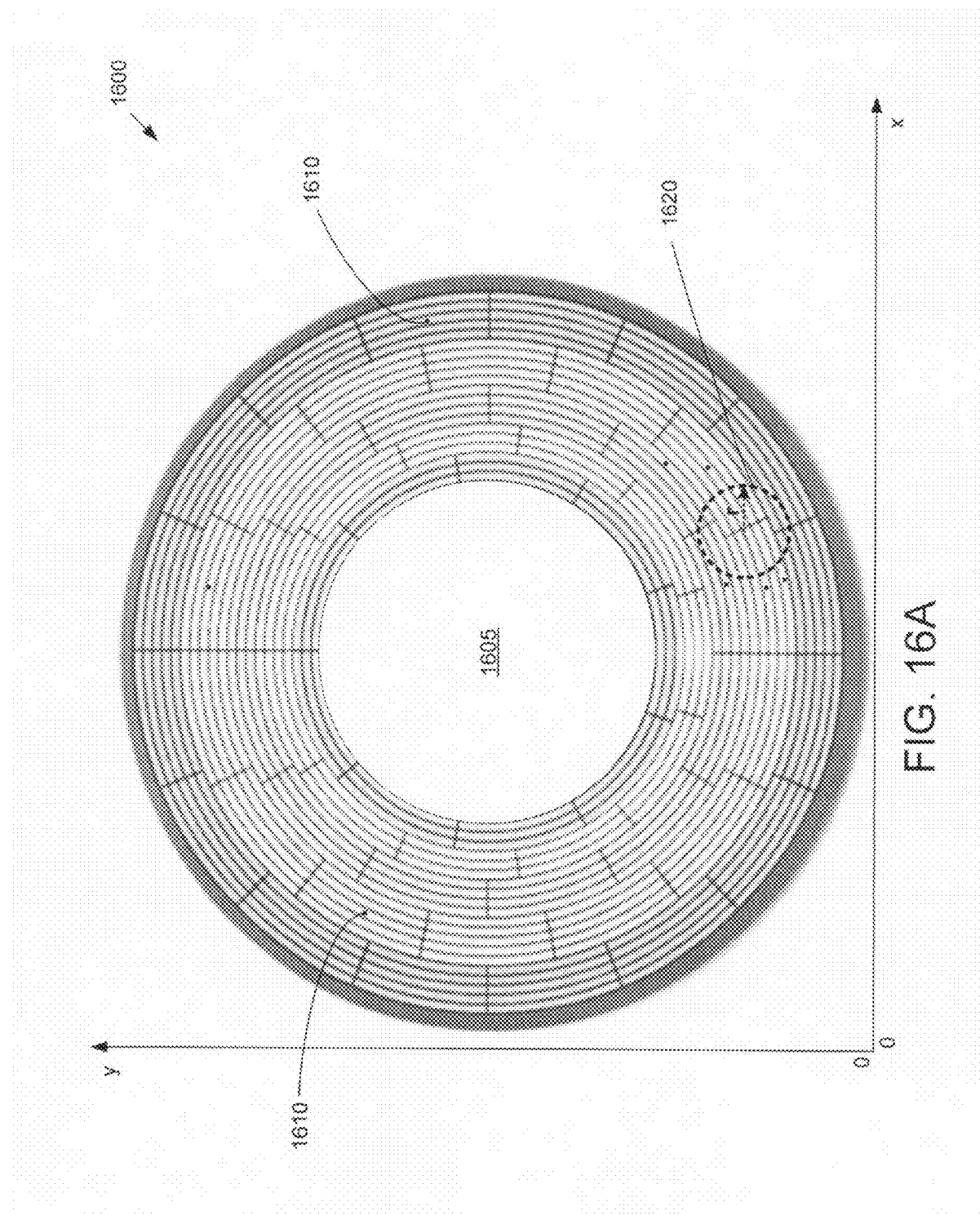
FIG. 16A shows an exemplary physical representation of a disk platter having an exemplary patch comprising a circle having a radius of a predetermined length.

As known in the art, a storage device comprises a plurality of stacked platters, each platter having a read/write head that retrieves and writes data to the platter. FIG. 16A shows a diagram of an exemplary platter 1605 that comprises a plurality of tracks (shown as concentric circles), each track being divided into a plurality of sectors (shown as segments of the concentric circles). A sector (block) comprises the smallest amount of storage space accessible on the storage device. If a particular sector on the storage device specified in a read/write request is damaged/faulty, the requested sector can not be properly accessed and a storage device error is encountered. A single physical defect on a platter of the storage device (e.g., a small scratch or foreign particle on the platter) may span several sectors on the platter and cause a plurality of storage device errors. A storage device exhibiting multiple errors that reach a specified error threshold may be failed by the storage management module 500 when, in fact, the flagged storage device 510 may have a single localized physical defect (causing one grouping of damaged sectors). Since, conventionally, the storage management module 500 counts each error as a separate error without determining whether the errors are localized to one physical area on the flagged storage device 510, the storage management module 500 may unnecessarily and prematurely fail flagged storage devices 510 and cause a higher rate of storage device failure than warranted.

In some embodiments, the storage management module 500 includes an evaluation module that evaluates/interprets storage device errors to determine whether any errors are due to damaged sectors localized in a single physical area (having a predetermined size) of a platter of the disk. The physical area of predetermined size on a platter is sometimes referred to herein as a "patch." The predetermined size of a patch may be specified in terms of physical dimensions (e.g., as expressed in centimeters or inches) or in terms of tracks and sectors (e.g., 5 tracks long by 3 sectors wide). In some embodiments, two or more errors due to two or more damaged sectors contained within the same patch on a platter of a disk may be considered a single error. In some embodiments, two or more errors due to two or more damaged sectors located within a predetermined threshold distance from each other on a platter may be considered a single error. The predetermined threshold distance may be specified in terms of a physical length (e.g., as expressed in centimeters or inches) or in terms of a number of tracks and/or sectors (e.g., within 3 tracks and/or 2 sectors). The grouping of two or more errors of a storage device into a single error may be used to determine whether the storage device has reached an error threshold of a particular error type.

Figure 15:
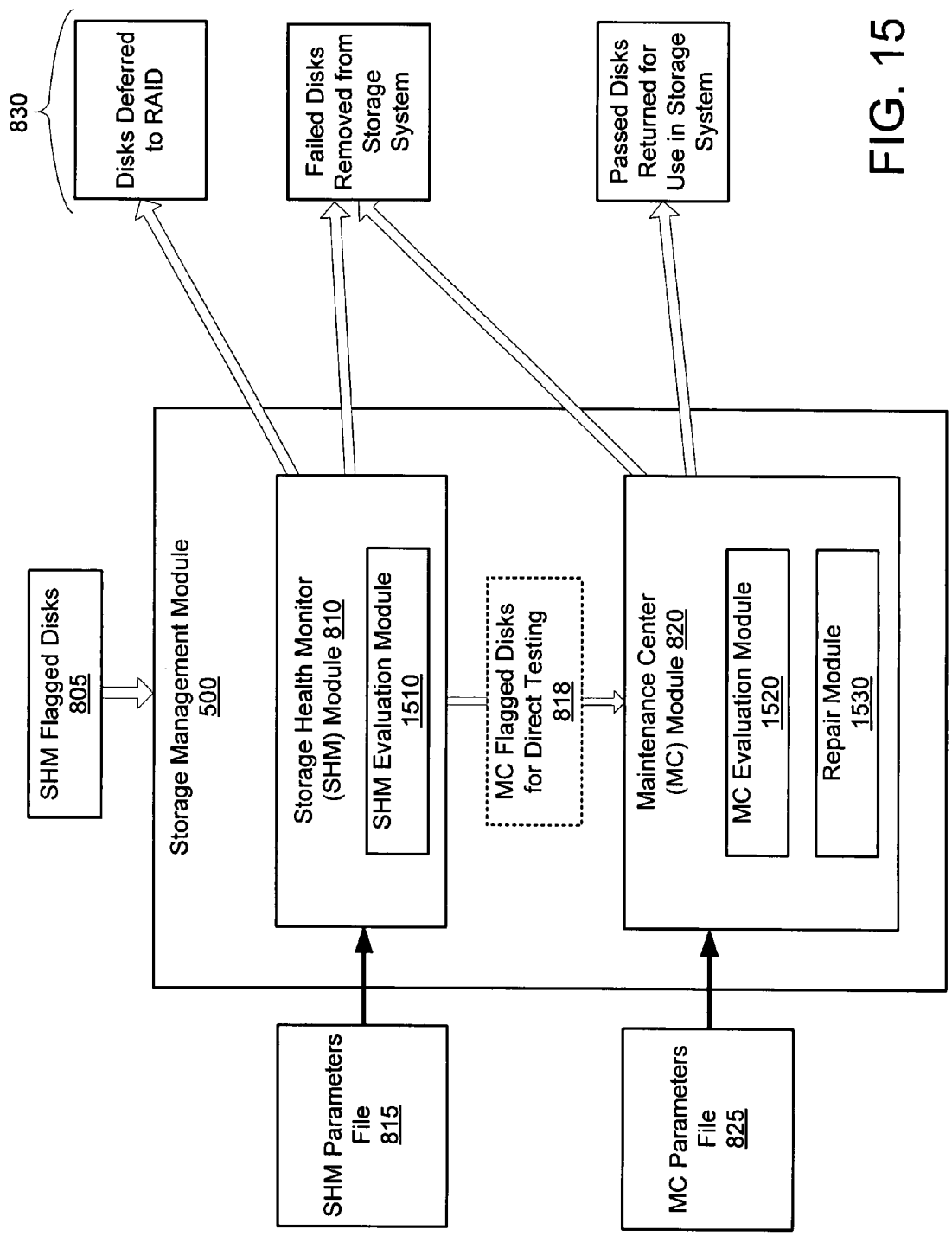
FIG. 15 shows a conceptual diagram of the storage management module comprising evaluation and repair modules.

FIG. 15 shows a conceptual diagram of the storage management module 500 comprising evaluation and repair modules for evaluating and repairing disk errors received during servicing of disks. As shown in FIG. 15, the storage health monitor (SHM) module 810 contains an SHM evaluation module 1510 and the maintenance center (MC) module 820 contains an MC evaluation module 1520 and a repair module 1530. The evaluation modules 1510 and 1520 receive data 420 regarding a set of two or more disk errors 410 of a flagged disk 510. In some embodiments, for each disk error 410, the received data 420 includes a logical block address contained in the read/write request that caused the disk error.

As known in the art, a particular sector on a disk is specified in a read/write request by a particular logical block address (sector number). When a read/write request includes a logical block address specifying a damaged/faulty sector, a storage device error is encountered. Although the logical block address of a sector is used to access the sector on a disk, the logical block address does not relate to the physical location of the sector on the disk. As such, the physical position of a first damaged sector relative to the physical position a second damaged sector on a disk can not be determined by comparing the logical block addresses of the two sectors. In some embodiments, the evaluation modules 1510 and 1520 translate/maps the received logical block addresses of disk errors to physical addresses to determine the physical position of the disk errors (i.e., the damaged sectors causing the disk errors) on a flagged disk. The physical addresses may be used to compare the physical position of two or more damaged sectors causing two or more disk errors to determine whether the two or more damaged sectors can be grouped as a single damaged area and the two or more disk errors grouped as a single disk error.

As known in the art, the logical block addressing scheme of a disk is particular to the disk itself, where each disk contains its own mapping scheme to translate logical block addresses to physical addresses. As such, in some embodiments, the evaluation modules 1510 and 1520 may translate received logical block addresses of errors to physical addresses by sending a request to a disk requesting the physical addresses of the logical block addresses. For example, a SCSI "Send Diagnostic" command may be sent to the disk along with a "Translate Address Page" containing a specified address, the format of the specified address (e.g., logical), and the format of the address to translate to (e.g., physical). A "Receive Diagnostic" command may then be sent to the disk with a page code associated with the "Translate Address Page," whereby the disk returns the requested data (i.e., the physical address of the specified logical block address).

As known in the art, the physical address of a sector of a disk specifies a head number (indicating the platter number of the disk where the sector is located), a cylinder number (indicating the track/circle number of the platter where the sector is located), and a sector number (indicating a specific section on the track that comprises the sector). As such, the physical address of a sector reflects the physical location of the sector on a disk. Therefore, the physical position of a first damaged sector relative to the physical position of a second damaged sector on a disk may be determined using the physical addresses of the two sectors to determine if they may be considered as a single damaged area.

Typically, however, each disk type (depending on manufacturer, model, version, etc.) implements a particular logical geometry that structures data onto the platters, tracks and sectors. Previously, the logical geometry of a disk specified the number of platters/heads, tracks per platter surface, and sectors per track. In modern disks, however, a "zone recording" geometry is typically implemented where tracks of a platter may comprise a different number of sectors depending on the distance of the track from the center of the platter. In zone recording, sets of tracks may be grouped into zones based on their distance from the center of the disk, where each zone is assigned a number of sectors per track (where zones/tracks towards the outer edge of the platter typically have more sectors per track).

In some embodiments, the logical geometry of a disk is also considered when determining the physical position of damaged sectors on a disk to determine if they may be considered as a single damaged area. In these embodiments, the evaluation modules 1510 and 1520 analyzes data regarding the logical geometry of a flagged disk 510 exhibiting errors. For example, the logical geometry of a disk may be determined by the disk type of the flagged disk 510 which is received in disk error data 420 regarding errors 410 of the disk (as shown in FIG. 4). Data regarding the logical geometry of a flagged disk may also be retrieved from the flagged disk itself. In some embodiments, for a flagged disk that does not implement zone recording geometry, the data regarding the logical geometry of the disk includes the number of platters/heads, tracks per platter surface, and sectors per track. In other embodiments, for a flagged disk that does implement zone recording geometry, the data regarding the logical geometry of the disk includes the number of platters/heads, number of zones on each platter surface (where zone 0 typically indicates the outer most zone), the number of tracks in each zone, and the number of sectors per track in each zone.

The evaluation modules 1510 and 1520 may then use the logical geometry data of a flagged disk to graph physical representations of one or more platters of the flagged disk indicating the physical locations of zones, tracks, and sectors relative to each other. FIG. 16A shows an example of a physical representation 1600 of an exemplary platter 1605 of a flagged disk 510 that may be produced using the logical geometry data of the flagged disk 510. Note that the physical representation 1600 indicates physical locations of different sectors of the platter 1605 relative to each other. As such, the physical representation 1600 of the platter may be used to determine the physical location of a first damaged sector relative to the physical location of a second damaged sector to determine whether the two damaged sectors should be grouped as a single damaged area (and hence the two errors caused by the two damaged sectors grouped as a single error). The evaluation modules 1510 and 1520 may graph physical representations of each platter of a flagged disk.

For a set of errors encountered on a particular platter of a flagged disk, the evaluation modules 1510 and 1520 may then plot the errors onto the physical representation of the particular platter. The evaluation modules 1510 and 1520 may do so by using the physical address (comprising a platter number, track number, and sector number) determined for each error which indicates a physical location of a damaged sector that caused the error. In the example of FIG. 16A, eight errors were encountered on the platter 1605 of the flagged disk 510 (e.g., during monitoring or testing of the flagged disk). Damaged sectors 1610 (indicated by a dot in the middle of a sector) causing the eight errors have been plotted to the physical representation 1600 of the platter 1605.

Figure 16B:
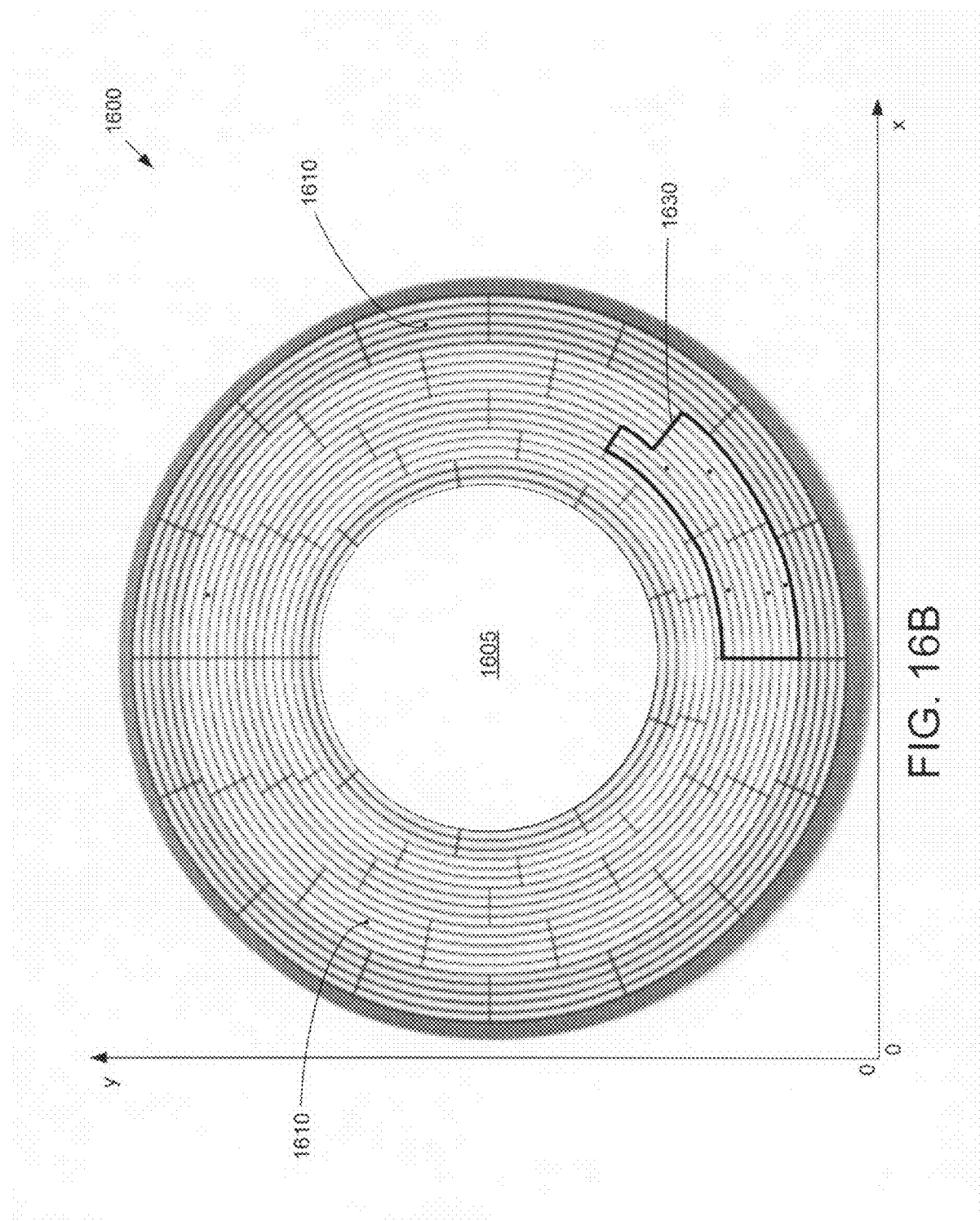
FIG. 16B shows an exemplary physical representation of a disk platter having an exemplary patch comprising an irregular polygon having a predetermined size.

The evaluation modules 1510 and 1520 may then determine whether two or more errors due to two or more damaged sectors are located within a predetermined threshold distance from each other on a same platter, and thus be considered a single error. The evaluation modules 1510 and 1520 may do so by determining whether the two or more damaged sectors 1610 on the platter 1605 are within a same physical area having a predetermined size (referred to as a patch). In some embodiments, a patch comprises any regular or irregular geometric shape (e.g., a square, ellipse, irregular shaped polygon, etc.) having a predetermined size. The predetermined size of a patch may be specified in terms of physical dimensions (e.g., as expressed in centimeters or inches) or in terms of tracks and sectors (e.g., 5 tracks long by 3 sectors wide). For example, FIG. 16A shows an exemplary patch 1620 comprising a circle having a radius (r) of a predetermined physical length (e.g., N centimeters). As a further example, FIG. 16B shows an exemplary patch 1630 comprising an irregular polygon having a predetermined size that is specified in terms of tracks and sectors. In the example of FIG. 16B, the predetermined size of the exemplary patch 1630 is 8 tracks long by 2 sectors wide. As shown in FIG. 16B, a patch 1630 having a predetermined size that is defined in terms of tracks and sectors may produce an irregular shaped polygon that varies in actual physical size depending on where the patch 1630 is placed on the platter (since the size of the sectors themselves vary depending on zone and track number).

In some embodiments, a sector that is completely or partially overlapped by a particular patch is considered to be part of the particular patch (i.e., contained within the patch). In other embodiments, a sector that is completely overlapped by a particular patch is considered to be part of the particular patch (i.e., contained within the patch). If the evaluation modules 1510 and 1520 determines that two or more damaged sectors on a platter can be overlapped/contained within the same patch, the two or more damaged sectors may be considered being located within a predetermined threshold distance from each other, and thus be grouped as a single damaged area on the platter. The evaluation modules 1510 and 1520 may then consider the two or more errors due to the two or more damaged sectors contained within the same patch as a single error.

In the examples of FIGS. 16A-B, eight errors were encountered on the platter 1605 of a flagged disk (three errors in the upper half and five errors in the lower half of the platter 1605) and damaged sectors 1610 (indicated by a dot in a sector) causing the eight errors have been plotted to the physical representation 1600 of the platter 1605. In the example of FIG. 16A, a single patch 1620 (comprising a circle of predetermined size) contains/overlaps each of five damaged sectors 1610 (errors) on the lower half of the platter 1605. Note that in the example of FIG. 16A, a sector is considered to be contained within a patch if it is partially overlapped by the patch. Similarly, in the example of FIG. 16B, a single patch 1630 (comprising a polygon of predetermined size) contains/overlaps each of five damaged sectors 1610 (errors) on the lower half of the platter 1605. Note that in the example of FIG. 16A, a sector may be considered to be contained within a patch if it is completely overlapped by the patch. As such, the five damaged sectors may be grouped as a single damaged area on the platter and the five errors caused by the five damaged sectors may be considered a single error. In other embodiments, other graphing methods or non-graphing methods (e.g., that apply mathematical formulas or algorithms) may be used to determine whether two or more damaged sectors are within a predetermined threshold distance from each other.

In some embodiments, the evaluation modules 1510 and 1520 may evaluate errors of a flagged disk 510 when the flagged disk has reached an error threshold of a particular error type (e.g., during monitoring or testing of the flagged disk). As discussed above, if a flagged disk 510 reaches an error threshold for a particular error type, a recommended action is determined and implemented for the flagged disk (e.g., failure and removal of the disk, deferring the disk to the RAID layer, begin direct testing of the disk, etc.). In some embodiments, prior to determining a recommended action for the disk, the storage management module 500 may implement the evaluation modules 1510 and 1520 to evaluate all the errors of the particular error type (for which the error threshold has been reached) to determine a new total number of errors. The evaluation modules 1510 and 1520 may group a set of two or more errors localized to a same physical area (patch) of a same platter into a single error in determining the new total number of errors. The evaluation modules 1510 and 1520 may do so for different groupings of localized errors located on different platters of a disk to determine the new total number of errors.

If the new total number of errors is determined to be lower than the error threshold value specified for the particular error type, the error threshold is considered not to be reached by the flagged disk 510. Therefore, a recommended action for the flagged disk 510 is not determined and implemented, and monitoring or testing of the flagged disk continues as before. As such, two or more localized errors contained within a patch may be considered a single error for counting against an error threshold for a particular error type and reduce the number of errors counted against the error threshold. For example, during monitoring or testing of a flagged disk, if the flagged disk reaches an error threshold of 10 errors of a particular error type, the evaluation modules 1510 and 1520 may evaluate the 10 errors and group 3 of the errors (that are within a same patch of a platter) into a single error. As such, the new total number of errors is 8 which is lower than the error threshold of 10. Therefore, a recommended action for the flagged disk is not determined and implemented, and monitoring or testing of the flagged disk continues as before.

B. Repair Module

A particular patch containing multiple damaged sectors (i.e., two or more sectors that exhibited an error of any error type) may indicate a physical defect (e.g., a small scratch or foreign particle) located within the patch that may eventually affect all sectors in the patch. Even though the patch may contain undamaged sectors that do not presently cause disk errors, read/write accesses to the undamaged sectors may produce disk errors in the future. Additionally, the patch may be extended to include more sectors on the outer edges of damaged sectors. It may be desirable then, to prevent access to all sectors of a patch that contains multiple damaged sectors to avoid future disk errors (rather than preventing access to only damaged sectors of platters, as conventionally done).

A patch overlapping two or more damaged sectors is referred to herein as a "damaged" patch. Note that a damaged patch may overlap and comprise a mixture of damaged sectors and undamaged sectors (i.e., sectors that have not exhibited errors of any error type). In some embodiments, a repair module 1530 of the storage management module 500 receives a damaged patch (comprising damaged and undamaged sectors) of a flagged disk 510 and remaps/reassigns each sector (including undamaged sectors) of the damaged patch to a spare sector of the flagged disk 510 so that none of the sectors of the damaged patch may be accessed in the future.

As known in the art, a damaged sector may be reassigned to a spare sector on the disk by reassigning the logical block address of the damaged sector to another logical block address that specifies the spare sector. For example, this may be performed by sending a command to the disk (e.g., "reassign address" SCSI command) along with the logical block address of the damaged sector. The disk will then reassign the logical block address of the damaged sector to the logical block address of a spare sector on the disk. The disk may log sector reassignments to a "grown defect list" that is stored on the disk (e.g., in nonvolatile RAM). The "grown defect list" may be used by the disk to redirect future read/write requests to reassigned damaged sectors to the corresponding assigned spare sectors. In some embodiments, however, undamaged sectors (i.e., sectors not exhibiting errors of any error type) of a damaged patch are also reassigned to spare sectors.

C. Methods for Evaluating and Repairing Disk Errors

Figure 17A:
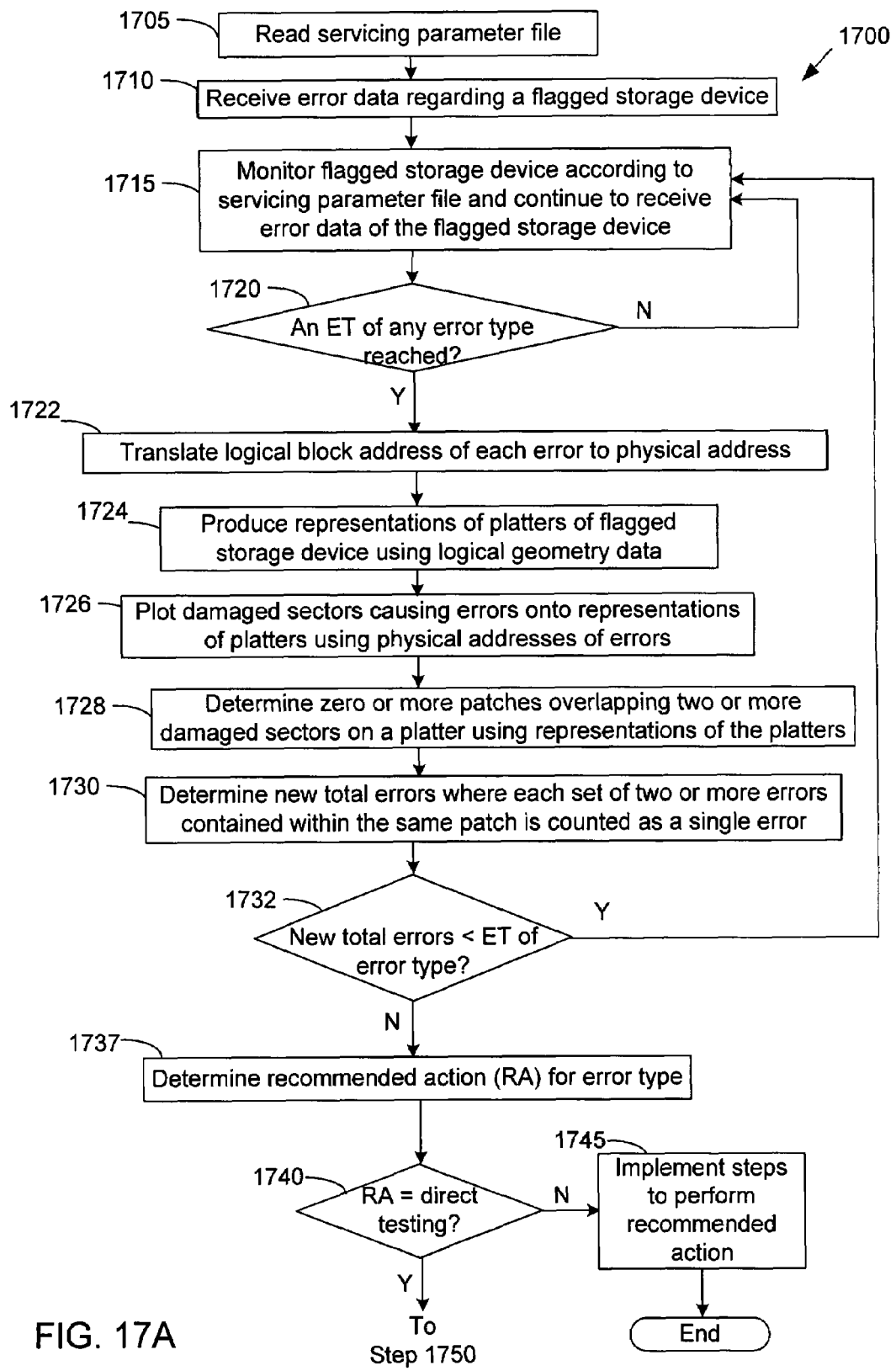
FIGS. 17A-B are flowcharts of a method for evaluating and repairing errors of storage devices of the storage system.
Figure 17B:
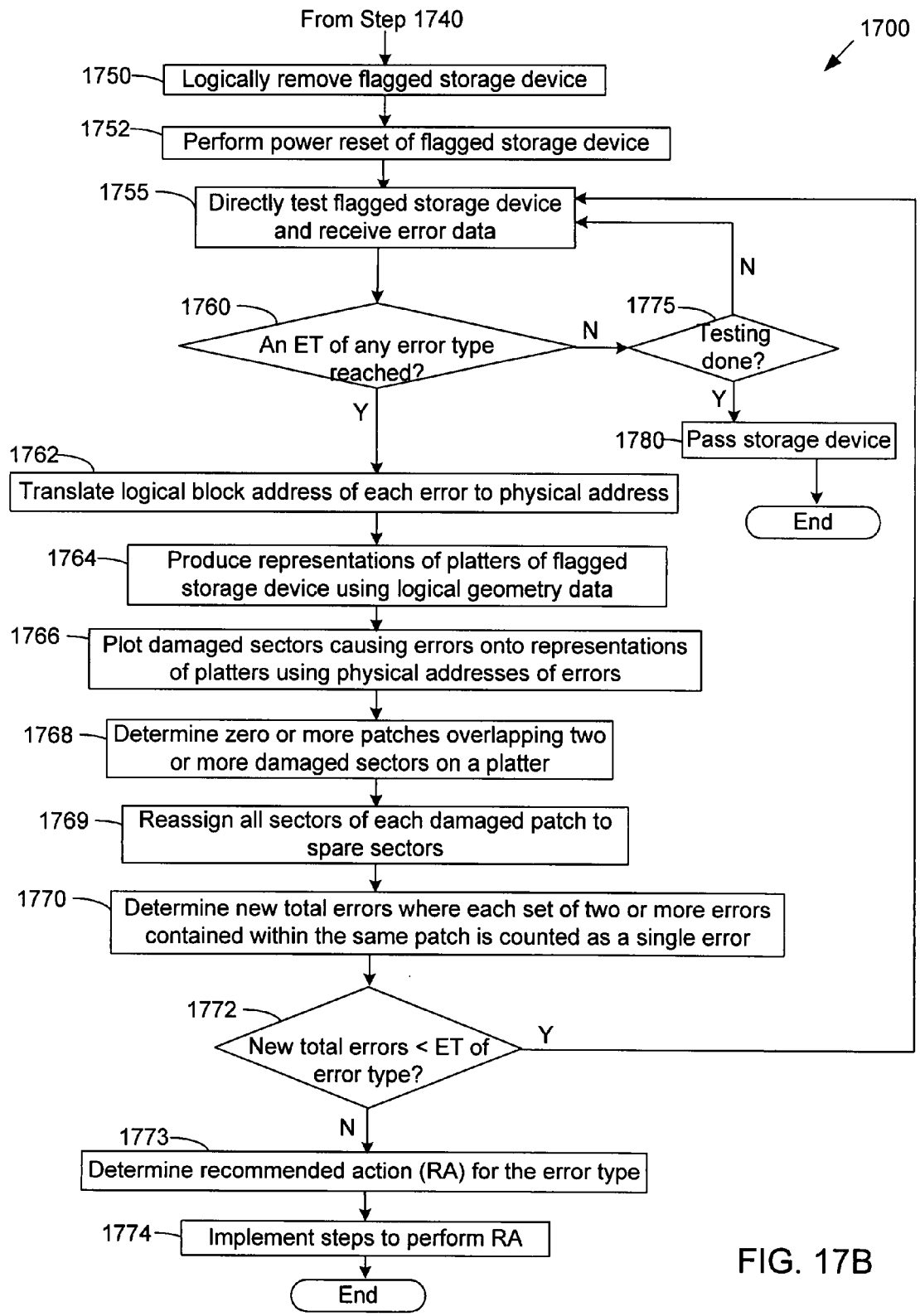

FIGS. 17A-B are flowcharts of a method 1700 for evaluating and repairing errors of storage devices of the storage system 200 encountered during monitoring or testing of the storage device. The storage operating system 300 comprises a storage management module 500 comprising an SHM module 810 configured for monitoring storage devices 140 and a MC module 820 configured for testing storage devices 140 in accordance with the servicing parameter file 700 (comprising parameters files 815 and 825). In some embodiments, some of the steps of the method 1700 are implemented by software or hardware. In some embodiments, some of the steps of method 1700 are performed by an SHM evaluation module 1510 of the SHM module 810 or an MC evaluation module 1520 of the MC module 820. The order and number of steps of the method 1700 are for illustrative purposes only and, in other embodiments, a different order and/or number of steps are used.

The method begins when the storage management module 500 reads (at 1705) the servicing parameter file 700 and stores the servicing parameters contained in the file 700 into memory. The SHM module 810 then receives (at 1710) data 420 regarding a flagged storage device 510 exhibiting an error. In some embodiments, the received data 420 comprises a unique identifier for the flagged storage device, the storage device type, the error type, and the logical block address of the error (i.e., the logical block address of the access request causing the error). The SHM module 810 may receive such error data 420 from a disk storage (RAID) layer 350 of the storage operating system 300. The SHM module 810 then monitors (at 1715) the flagged storage device 510 according to the parameters of the servicing parameter file 700 and continues to receive data from the disk storage layer 350 regarding any errors of the flagged storage device 510.

At step 1720, the SHM module 810 determines whether the flagged storage device 510 has exhibited a set of errors that has reached (in number) an error threshold (ET) for any error type (as specified in the servicing parameter file 700). If not, the method continues at step 1715 (where the SHM module 810 continues to monitor and receive data regarding any errors of the flagged storage device 510). If so, the set of errors of the particular error type of the flagged storage device 510 has an original total number of errors equal to the error threshold value specified for the particular error type. The SHM evaluation module 1510 of the SHM module 810 then evaluates, in steps 1722 through 1732, the set of errors of the flagged storage device 510 to determine a new total number of errors for the set after considering any physical localization of the errors in the set. In some embodiments, the particular graphing method described in steps 1722 through 1732 is used to determine physical localization of the errors in the set. In other embodiments, other graphing methods or non-graphing methods (e.g., that apply mathematical formulas or algorithms) may be used to determine physical localization of the errors in the set.

At step 1722, for each error in the set of errors for the flagged storage device 510, the SHM evaluation module 1510 translates the logical block address of the error to a physical address (e.g., by sending SCSI "Send Diagnostic" and "Receive Diagnostic" commands to the flagged storage device 510 and receiving the physical addresses from the flagged storage device 510). The physical addresses indicate the physical location on the flagged storage device 510 of damaged sectors that caused the set of errors of the flagged storage device 510. In some embodiments, the SHM evaluation module 1510 uses the physical addresses of the set of errors to determine whether two or more errors in the set due to two or more damaged sectors are located within a predetermined threshold distance from each other on a same platter, and thus be considered a single error.

In some embodiments, the SHM evaluation module 1510 may do so by determining whether two or more damaged sectors on a same platter are within a same physical area (patch) having a predetermined size. In these embodiments, the SHM evaluation module 1510 may produce/graph (at 1724) physical representations 1600 of one or more platters of the flagged storage device 510 using the logical geometry data of the flagged storage device 510 (e.g., as determined from the storage device type of the flagged storage device 510). The SHM evaluation module 1510 then plots (at 1726) the damaged sectors that caused the set of errors of the flagged storage device 510 onto the physical representations 1600 of the platters using the physical addresses of the set of errors. Using the physical representations 1600 of the platters, the SHM evaluation module 1510 then determines (at 1728) zero or more patches overlapping/containing two or more damaged sectors on a same platter. The SHM evaluation module 1510 may do so by attempting to use the fewest number of patches to overlap the most number of damaged sectors on a platter (thus grouping a larger number errors into a single error) using graphing algorithms or methods known in the art (such as bounding container algorithms).

The SHM evaluation module 1510 then determines (at 1730) a new total number of errors for the flagged storage device 510, where each set of two or more damaged sectors/errors contained within the same patch is counted as a single error towards the new total number of errors. The method 1700 then determines (at 1732) whether the new total number of errors for the flagged storage device 510 is less than the error threshold specified for the error type. If so, the method continues at step 1715 (where the SHM module 810 continues to monitor and receive data regarding any errors of the flagged storage device 510). If not, the method continues at step 1737.

At step 1737, the method 1700 determines a recommended action specified (in the servicing parameter file 700) for the error type for which the error threshold has been reached. The method then determines (at 1740) whether the recommended action is direct testing of the flagged storage device 510. If not, the method implements (at 1745) steps to perform the recommended action and the method ends. If so, the storage management module 500 returns a status to the RAID layer 350 to logically remove (at 1750) the flagged storage device from the set of storage devices 140 of the storage system 200.

In some embodiments, before testing the flagged storage device 510, the storage management module 500 performs a power reset of the flagged storage device 510 to reset the internal program of the flagged storage device 510 (e.g., by sending to the flagged storage device 510 a special reset command, or by sending the storage shelf controller a command to power cycle the storage device). This causes power to be removed and reapplied to the flagged storage device 510 causing the flagged storage device 510 to reinitialize/reboot its firmware and recalibrate its components which may correct internal disk problems, problems caused by disk firmware errors, or transient errors.

The MC module 820 then directly tests (at 1755) the flagged storage device according to the parameters of the servicing parameter file 700. During testing of the flagged storage device, the MC module 820 receives (at 1755) data from the flagged storage device regarding any errors encountered in performing the tests, the data including logical block addresses of the errors. At step 1760, the MC module 820 determines whether an error threshold of any error type (as specified in the servicing parameter file 700) has been reached for the flagged storage device 510 during testing. If not, the method determines (at 1775) whether all testing specified in the servicing parameter file 700 has been completed. If not, the method 1700 continues at step 1755. If so, the flagged storage device 510 has passed testing and the storage management module 500 returns (at 1780) a successful status to the RAID layer 350 to use the flagged storage device in the storage system 200. The method then ends.

If the MC module 820 determines (at step 1760—Yes) that an error threshold of an error type has been reached for the flagged storage device 510, the set of errors of the flagged storage device 510 has an original total number of errors of the particular error type equal to the error threshold value specified for the particular error type. The MC evaluation module 1520 of the MC module 820 then evaluates, in steps 1762 through 1772, the set of errors of the flagged storage device 510 to determine a new total number of errors for the flagged storage device 510 after considering any physical localization of the errors in the set. Steps 1762 through 1772 are similar to steps 1722 through 1732 discussed above. As such, only those steps that differ will be discussed in detail here.

At step 1762, for each error in the set of errors for the flagged storage device 510, the MC evaluation module 1520 translates the logical block address of the error to a physical address. The MC evaluation module 1520 may produce/graph (at 1764) physical representations 1600 of one or more platters of the flagged storage device 510 using the logical geometry data of the flagged storage device 510 (e.g., as determined from the storage device type of the flagged storage device 510). The MC evaluation module 1520 then plots (at 1766) the damaged sectors that caused the set of errors of the flagged storage device 510 onto the physical representations 1600 of the platters using the physical addresses of the set of errors.

The MC evaluation module 1520 then determines (at 1768) zero or more patches overlapping/containing two or more damaged sectors on a same platter. In some embodiments, for each "damaged" patch overlapping two or more damaged sectors on a platter, each sector of the "damaged" patch is reassigned (at 1769) to a spare sector by the repair module 1530 of the storage management module 500. In some embodiments, the repair module 1530 reassigns damaged as well as undamaged sectors overlapped by a damaged patch. The repair module 1530 may do so by sending commands (e.g., "re-assign address" SCSI commands) to the flagged storage device 510 along with the logical block addresses of the damaged sectors.

The MC evaluation module 1520 then determines (at 1770) a new total number of errors for the flagged storage device 510, where each set of two or more damaged sectors/errors contained within the same patch is counted as a single error towards the new total number of errors. The method 1700 then determines (at 1772) whether the new total number of errors for the flagged storage device 510 is less than the error threshold specified for the error type. If so, the method continues at step 1755 (where the MC module 820 continues to test and receive data regarding any errors of the flagged storage device 510). If not, the MC module 820 determines (at 1773) a recommended action specified (in the servicing parameter file 700) for the error type for which the error threshold has been reached. The method then implements (at 1774) steps to perform the recommended action. The method then ends.

As described above, two or more errors of a storage device may be grouped as a single error when the errors are caused by damaged sectors localized to the same physical area (of a predetermined size) of the storage device. As such, a single physical defect (e.g., a small scratch or foreign particle) on a platter of the storage device that spans several sectors on the platter and causes a plurality of storage device errors will be considered a single damaged area and the plurality of storage device errors caused by the single damaged area considered a single error. By considering physical localization of errors on a storage device, unnecessary and premature testing or failing of storage devices can be reduced.

While the embodiments described herein have been described with reference to numerous specific details, one of ordinary skill in the art will recognize that the embodiments can be embodied in other specific forms without departing from the spirit of the embodiments. Thus, one of ordinary skill in the art would understand that the embodiments described herein are not to be limited by the foregoing illustrative details, but rather are to be defined by the appended claims.

We claim:

1. A system for evaluating errors of storage devices of a storage system, the system comprising:
    the storage system comprising a set of one or more storage devices and an evaluation module; and
    the evaluation module configured for:
        evaluating a set of errors of a particular storage device based on the physical location of damaged sectors on the particular storage device causing the set of errors;
        based on the evaluation, determining that two or more damaged sectors causing two or more errors are within a predetermined threshold distance from each other in the particular storage device; and
        grouping the two or more errors as a single error of the particular storage device.

2. The system of claim 1, wherein the evaluation module is further configured for:
    translating logical block addresses of the set of errors of the particular storage device to physical addresses; and
    determining that the two or more damaged sectors causing two or more errors are within a predetermined threshold distance from each other in the particular storage device using the physical addresses of the two or more errors.

3. The system of claim 1, wherein:
    the storage device comprises at least one platter comprising a plurality of tracks, each track comprising a plurality of sectors; and
    the two or more damaged sectors are within a predetermined threshold distance from each other on a platter of the particular storage device.

4. The system of claim 1, wherein the predetermined threshold distance is specified in terms of a physical length or in terms of a number of tracks or sectors.

5. The system of claim 1, wherein the evaluation module is further configured for:
    evaluating the set of errors of the particular storage device upon the number of errors in the set of errors reaching an error threshold; and
    counting the two or more errors grouped as a single error as one error in determining whether the number of errors of the particular storage device have reached the error threshold.

6. The system of claim 1, further comprising a storage management module configured for:
    testing the particular storage device; and
    sending a power reset command to the particular storage device prior to testing the particular storage device.

7. The system of claim 1, wherein the evaluation module is further configured for:
    determining logical geometry data of the particular storage device;
    graphing a physical representation of the particular storage device using the logical geometry data;
    translating logical block addresses of the set of errors of the particular storage device to physical addresses; and
    plotting damaged sectors causing the set of errors onto the physical representation of the particular storage device.

8. The system of claim 7, wherein the evaluation module is configured to determine that the two or more damaged sectors are within a predetermined threshold distance from each other by determining that the two or more damaged sectors are within a same physical area of a predetermined size on the particular storage device.

9. The system of claim 8, wherein the same physical area of the predetermined size comprises damaged and undamaged sectors, the system further comprising:
    a repair module configured for reassigning all sectors of the same physical area of the predetermined size to spare sectors on the particular storage device, the predetermined size being specified in terms of physical dimensions or in terms of tracks and sectors.

10. A method for evaluating errors of storage devices of a storage system, the method comprising:
    evaluating, by the storage system, a set of errors of a particular storage device based on the physical location of damaged sectors on the particular storage device causing the set of errors;
    based on the evaluation, determining that two or more damaged sectors causing two or more errors are within a predetermined threshold distance from each other in the particular storage device; and grouping the two or more errors as a single error of the particular storage device.

11. The method of claim 10, further comprising:

translating logical block addresses of the set of errors of the particular storage device to physical addresses; and determining that the two or more damaged sectors causing two or more errors are within a predetermined threshold distance from each other in the particular storage device using the physical addresses of the two or more errors.

12. The method of claim 10, further comprising:

evaluating the set of errors of the particular storage device upon the number of errors in the set of errors reaching an error threshold; and counting the two or more errors grouped as a single error as one error in determining whether the number of errors of the particular storage device have reached the error threshold.

13. The method of claim 10, further comprising:

testing the particular storage device; and sending a power reset command to the particular storage device prior to testing the particular storage device.

14. The method of claim 10, further comprising:

determining logical geometry data of the particular storage device;

graphing a physical representation of the particular storage device using the logical geometry data;

translating logical block addresses of the set of errors of the particular storage device to physical addresses; and plotting damaged sectors causing the set of errors onto the physical representation of the particular storage device.

15. The method of claim 14, wherein determining that the two or more damaged sectors are within a predetermined threshold distance from each other comprises determining that the two or more damaged sectors are within a same physical area of a predetermined size on the particular storage device, the predetermined size being specified in terms of physical dimensions or in terms of tracks and sectors.

16. The method of claim 15, wherein the same physical area of the predetermined size comprises damaged and undamaged sectors, the method further comprising:

reassigning all sectors of the same physical area of the predetermined size to spare sectors on the particular storage device.

17. A computer-program product comprising a computer readable medium having instructions stored thereon when executed, evaluate errors of storage devices of a storage system, the computer-program product comprising sets of instructions for:

evaluating a set of errors of a particular storage device based on the physical location of damaged sectors on the particular storage device causing the set of errors;

based on the evaluation, determining that two or more damaged sectors causing two or more errors are within a predetermined threshold distance from each other in the particular storage device; and grouping the two or more errors as a single error of the particular storage device.

18. The computer-program product of claim 17, further comprising sets of instructions for:

translating logical block addresses of the set of errors of the particular storage device to physical addresses; and determining that the two or more damaged sectors causing two or more errors are within a predetermined threshold distance from each other in the particular storage device using the physical addresses of the two or more errors.

19. The computer-program product of claim 17, further comprising sets of instructions for:

evaluating the set of errors of the particular storage device upon the number of errors in the set of errors reaching an error threshold; and counting the two or more errors grouped as a single error as one error in determining whether the number of errors of the particular storage device have reached the error threshold.

20. The computer-program product of claim 17, further comprising sets of instructions for:

testing the particular storage device; and sending a power reset command to the particular storage device prior to testing the particular storage device.

21. The computer-program product of claim 17, further comprising sets of instructions for:

determining logical geometry data of the particular storage device;

graphing a physical representation of the particular storage device using the logical geometry data;

translating logical block addresses of the set of errors of the particular storage device to physical addresses; and plotting damaged sectors causing the set of errors onto the physical representation of the particular storage device.

22. The computer-program product of claim 21, wherein the set of instructions for determining that the two or more damaged sectors are within a predetermined threshold distance from each other comprises a set of instructions for determining that the two or more damaged sectors are within a same physical area of a predetermined size on the particular storage device, the predetermined size being specified in terms of physical dimensions or in terms of tracks and sectors.

23. The computer-program product of claim 22, wherein the same physical area of the predetermined size comprises damaged and undamaged sectors, the computer-program product further comprising a set of instructions for:

reassigning all sectors of the same physical area of the predetermined size to spare sectors on the particular storage device.

* * * * *